United States Patent
Aoki et al.

(10) Patent No.: US 10,044,054 B2
(45) Date of Patent: Aug. 7, 2018

(54) LAMINATED BATTERY, SEPARATOR AND CONNECTION METHOD OF INTERNAL RESISTANCE MEASURING DEVICE

(71) Applicant: NISSAN MOTOR CO., LTD., Yokohama-shi, Kanagawa (JP)

(72) Inventors: Tetsuya Aoki, Kanagawa (JP); Masanobu Sakai, Kanagawa (JP); Kei Sugimoto, Kanagawa (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 0 days.

(21) Appl. No.: 15/128,344

(22) PCT Filed: Mar. 28, 2014

(86) PCT No.: PCT/JP2014/059263
§ 371 (c)(1),
(2) Date: Sep. 22, 2016

(87) PCT Pub. No.: WO2015/145755
PCT Pub. Date: Oct. 1, 2015

(65) Prior Publication Data
US 2017/0104230 A1    Apr. 13, 2017

(51) Int. Cl.
| | | |
|---|---|---|
| *H01M 8/0202* | (2016.01) | |
| *H01M 8/04* | (2016.01) | |
| *G01R 31/36* | (2006.01) | |
| *H01M 8/04537* | (2016.01) | |
| *H01M 8/2483* | (2016.01) | |
| *H01M 8/241* | (2016.01) | |
| *H01M 8/242* | (2016.01) | |

(Continued)

(52) U.S. Cl.
CPC .... *H01M 8/04649* (2013.01); *G01R 31/3662* (2013.01); *H01M 8/0202* (2013.01); *H01M 8/04589* (2013.01); *H01M 8/1004* (2013.01); *H01M 8/241* (2013.01); *H01M 8/242* (2013.01); *H01M 8/2483* (2016.02); *H01M 2008/1095* (2013.01)

(58) Field of Classification Search
None
See application file for complete search history.

(56) References Cited

U.S. PATENT DOCUMENTS

2009/0068506 A1    3/2009   Tomura
2010/0141262 A1    6/2010   Watanabe et al.
(Continued)

FOREIGN PATENT DOCUMENTS

JP     2012-221878 A    11/2012
WO   WO 2012/077450 A1    6/2012

*Primary Examiner* — Jonathan Crepeau
(74) *Attorney, Agent, or Firm* — Foley & Lardner LLP

(57) ABSTRACT

A separator of a fuel cell to be laminated while sandwiching a membrane electrode assembly forming a power generation region includes a source connection point tab for inputting and outputting an alternating current for internal resistance measurement, a sense connection point tab for detecting a potential of the alternating current input and output to and from the source connection point tab and separation portion configured to separate the sense connection point tab from a current path of the alternating current for internal resistance measurement from the source connection point tab to the power generation region.

9 Claims, 22 Drawing Sheets

(51) Int. Cl.
*H01M 8/1004* (2016.01)
*H01M 8/1018* (2016.01)

(56) References Cited

U.S. PATENT DOCUMENTS

2012/0107714 A1* 5/2012 Day .................... H01M 8/0273
429/457
2013/0249562 A1 9/2013 Sakai et al.

* cited by examiner

LAMINATED BATTERY, SEPARATOR AND CONNECTION METHOD OF INTERNAL RESISTANCE MEASURING DEVICE

TECHNICAL FIELD

The present invention relates to a laminated battery, a separator and a connection method of an internal resistance measuring device.

BACKGROUND ART

It is disposed in WO2012/077450A1 to connect, as a conventional internal resistance measuring device of a laminated battery, a source line and a sense line to a separator of a laminated battery in different paths. This conventional internal resistance measuring device of the laminated battery has measured an internal resistance of the laminated battery by causing an alternating current to flow in a power generation region of the separator via the source line and inputting an alternating-current potential at that time to the internal resistance measuring device via the sense line.

SUMMARY OF INVENTION

However, the conventional internal resistance measuring device of the laminated battery described above has not taken into account the effect of a voltage drop caused in a non-power generation region of the separator from the sense line to the power generation region of the separator. Thus, the alternating-current potential input to the internal resistance measuring device via the sense line has been affected by the voltage drop caused in the non-power generation region of the separator.

This has caused a problem of causing an error between an internal resistance calculated by the internal resistance measuring device and an actual internal resistance.

The present invention was developed focusing on such a problem and aims to provide a laminated battery, a separator and a connection method of an internal resistance measuring device capable of improving accuracy in measuring an internal resistance calculated by the internal resistance measuring device.

According to one aspect of the present invention, a separator of a fuel cell to be laminated while sandwiching a membrane electrode assembly forming a power generation region is provided. The separator includes a source connection point tab for inputting and outputting an alternating current for internal resistance measurement, and a sense connection point tab for detecting a potential of the alternating current that is input and output through the source connection point tab. Furthermore, the separator includes separation portion configured to separate the sense connection point tab from a current path of the alternating current for internal resistance measurement from the source connection point tab to the power generation region.

DESCRIPTION OF EMBODIMENTS

Hereinafter, embodiments of the present invention are described with reference to the drawings and the like.

(First Embodiment)

Figure 1:
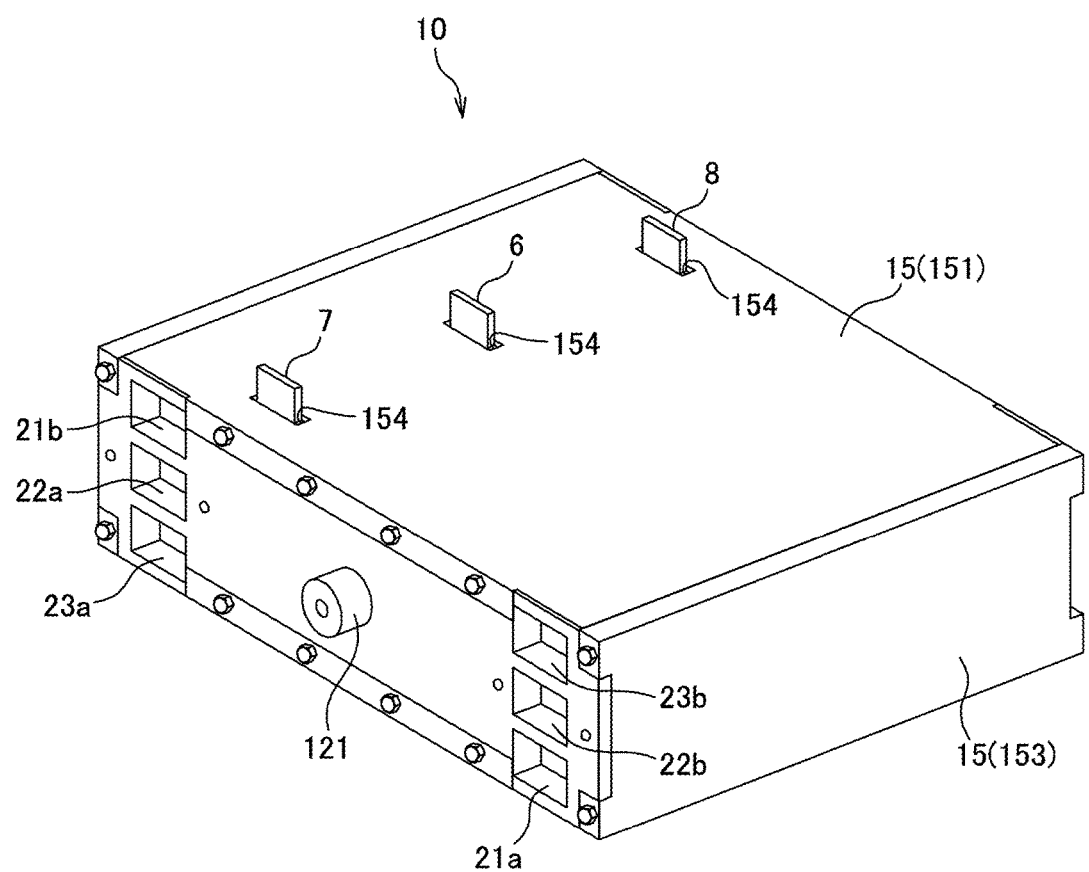
FIG. 1 is a perspective view of a fuel cell stack according to a first embodiment of the present invention.
Figure 2:
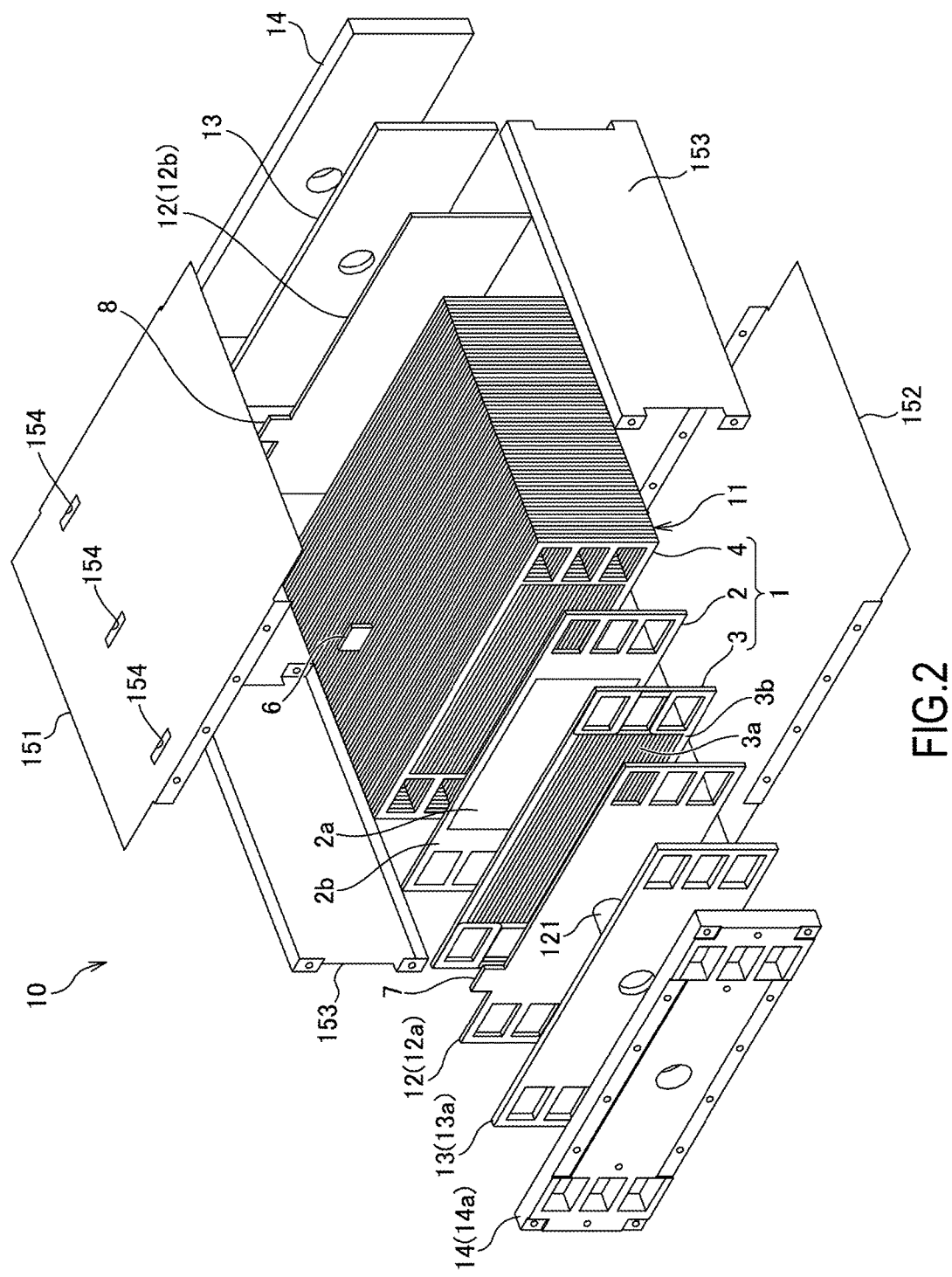
FIG. 2 is an exploded perspective view of the fuel cell stack.

FIG. 1 is a perspective view of a fuel cell stack 10 according to a first embodiment of the present invention. FIG. 2 is an exploded perspective view of the fuel cell stack 10.

As shown in FIGS. 1 and 2, the fuel cell stack 10 includes a laminated battery 11, a pair of current collector plates 12, a pair of insulating plates 13, a pair of end plates 14 and a casing 15.

The laminated battery 11 is such that a plurality of fuel cells 1 are laminated and connected in series.

The fuel cell 1 is, for example, a unit cell of a solid polymer type fuel battery. As shown in FIG. 2, the fuel cell 1 includes a MEA plate 2 in which a membrane electrode assembly (hereinafter, referred to as "MEA") 2a is arranged in a central part, a cathode separator 3 arranged on one surface side (front side in FIG. 2) of the MEA plate 2 and an anode separator 4 arranged on the other surface side (back side in FIG. 2) of the MEA plate 2.

The MEA 2a arranged in the central part of the MEA plate 2 has a cathode overlapped on one surface side of an electrolyte membrane and an anode overlapped on the other surface side. A potential difference of about 1 [V] is generated between the cathode and the anode by supplying cathode gas containing oxygen to the cathode of the MEA 2a and supplying anode gas containing hydrogen to the anode. The MEA 2a may have a rectangular shape as in the present embodiment or may have a polygonal or circular shape by cutting off four corners for material saving.

The MEA plate 2 is a thin rectangular plate-like member. The MEA plate 2 is an integrated assembly of the MEA 2a and a frame 2b formed of an insulating material such as resin.

The cathode separator 3 is a thin rectangular electrically conductive metal plate. The cathode separator 3 is formed such that a central part to be held in contact with the MEA 2a has a corrugated shape to be alternately concave and convex along a short side direction of the cathode separator 3. This central part of the cathode separator 3 for forming a cell by being held in contact with the MEA 2a is referred to as a "power generation region 3a" and its surrounding part is referred to as a "non-power generation region 3b" if necessary below.

When the cathode separator 3 is overlapped with the MEA plate 2, a plurality of flow passage grooves extending in a long side direction of the cathode separator 3 are formed in the power generation region 3a between the cathode separator 3 and the MEA plate 2. These flow passage grooves serve as cathode gas flow passages for supplying the cathode gas to the MEA 2a.

In the present embodiment, a tab 6 for connecting an internal resistance measuring device to be described later is formed on one cathode separator 3 located in a central part of the laminated battery 11. This tab 6 formed on the one cathode separator 3 located in the central part of the laminated battery 11 is particularly referred to as an "intermediate tab 6" below. Further, the cathode separator 3 formed with the intermediate tab 6 is particularly referred to as an "intermediate separator".

It should be noted that the position of the cathode separator 3 formed with the intermediate tab 6 is not limited to the central part of the laminated battery 11. Further, the intermediate tab 6 may be formed not on the cathode separator 3, but on the anode separator 4 and has only to be formed on either one of the cathode separator 3 and the anode separator 4 of one fuel cell 1 selected from the laminated battery 11.

The anode separator 4 is also a thin rectangular electrically conductive metal plate and has a similar shape to the cathode separator 3. Specifically, the anode separator 4 is also formed such that a central part to be held in contact with the MEA 2a has a corrugated shape to be alternately concave and convex along a short side direction of the anode separator 4.

When the anode separator 4 is overlapped with the MEA plate 2, a plurality of flow passage grooves extending in a long side direction of the anode separator 4 are formed between the anode separator 4 and the MEA plate 2. These flow passage grooves serve as anode gas flow passages for supplying the anode gas to the MEA 2a. Further, when the anode separator 4 is overlapped with the cathode separator 3, a plurality of flow passage grooves extending in the long side direction are also formed between the anode separator 4 and the cathode separator 3. These flow passage grooves serve as cooling water flow passages for causing cooling water to flow between the anode separator 4 and the cathode separator 3.

The current collector plates 12 are respectively arranged on outer sides of the laminated battery 11. The current collector plate 12 is a thin rectangular plate-like member and formed, for example, of a gas impermeable electrically conductive material such as density carbon. The current collector plate 12 includes a power extraction terminal 121 for extracting generated power of the laminated battery 11 and a tab 7, 8 for connecting the internal resistance measuring device to be described later. The tab 7 of the current collector plate 12a on a positive electrode side is referred to as a "positive electrode tab 7" and the tab 8 of the current collector plate 12b on a negative electrode side is referred to as a "negative electrode tab 8" below.

The insulating plates 13 are respectively arranged on outer sides of the current collector plates 12. The insulating plate 13 is a thin rectangular plate-like member and formed, for example, of an insulating material such as rubber.

The end plates 14 are respectively arranged on outer sides of the insulating plates 13. The end plate 14 is a thin rectangular plate-like member and formed, for example, of a rigid metallic material such as steel.

The casing 15 includes an upper surface plate 151, a lower surface plate 152 and a pair of side surface plates 153. The casing 15 holds the laminated battery 11, the current collector plates 12, the insulating plates 13 and the end plates 14 in a laminated state by these members. The upper surface plate 151 of the casing 15 is formed with three openings 154 for exposing the intermediate tab 6, the positive electrode tab 7 and the negative electrode tab 8.

Each of the MEA plate 2, the cathode separator 3, the anode separator 4, the current collector plate 12a on the positive electrode side, the insulating plate 13a on the positive electrode side and the end plate 14a on the positive electrode side includes a cathode gas discharge manifold 21b, a cooling water supply manifold 22a and an anode gas supply manifold 23a on one end side (left side in FIG. 2) thereof in the long side direction.

Further, each of the MEA plate 2, the cathode separator 3, the anode separator 4, the current collector plate 12a on the positive electrode side, the insulating plate 13a on the positive electrode side and the end plate 14a on the positive electrode side includes an anode gas discharge manifold 23b, a cooling water discharge manifold 22b and a cathode gas supply manifold 21a on the other end side (right side in FIG. 2) thereof in the long side direction.

Each manifold forms one passage when the fuel cell stack 10 is in a laminated state.

The cathode gas introduced into the cathode gas supply manifolds 21a from the outside of the fuel cell stack 10 is distributed into the cathode gas flow passages of each cathode separator 3 and discharged to the outside of the fuel cell stack 10 from the cathode gas discharge manifolds 21b.

The anode gas introduced into the anode gas supply manifolds 23a from the outside of the fuel cell stack 10 is distributed into the anode gas flow passages of each anode separator 4 and discharged to the outside of the fuel cell stack 10 from the anode gas discharge manifolds 23b.

The cooling water introduced into the cooling water supply manifolds 22a from the outside of the fuel cell stack 10 is distributed into the cooling water flow passages between the respective separators and discharged to the outside of the fuel cell stack 10 from the cooling water discharge manifolds 22b.

Figure 3:
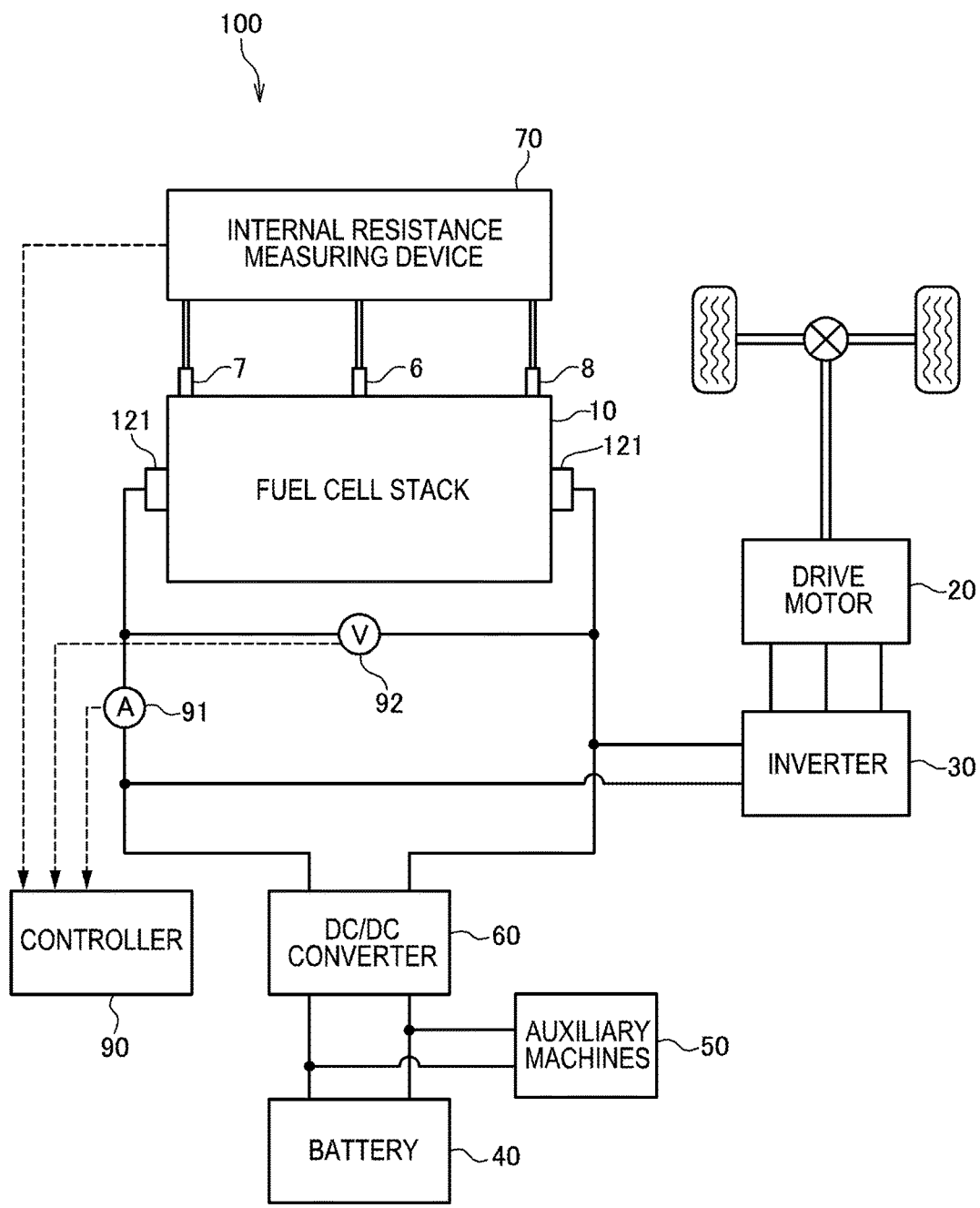
FIG. 3 is a schematic diagram of a fuel cell system using the fuel cell stack according to the first embodiment of the present invention as a power source for driving a vehicle.

FIG. 3 is a schematic diagram of a fuel cell system 100 using the fuel cell stack 10 according to the first embodiment of the present invention as a power source for driving a vehicle.

The fuel cell system 100 includes the fuel cell stack 10, a current sensor 91, a voltage sensor 92, a drive motor 20, an inverter 30, a battery 40, auxiliary machines 50, a DC/DC converter 60, an internal resistance measuring device 70 and a controller 90. It should be noted that devices for supplying and discharging the cathode gas, the anode gas and the cooling water to and from the fuel cell stack 10 are not shown in FIG. 3 to prevent the complication of the drawing.

The current sensor 91 detects a current extracted from the fuel cell stack 10 (hereinafter, referred to as an "output current").

The voltage sensor 92 detects a voltage between the power extraction terminals 121 of the current collector plates 12 (hereinafter, referred to as an "output voltage").

The drive motor 20 is a three-phase alternating-current synchronous motor in which a permanent magnet is embedded in a rotor and a stator coil is wound around a stator. The drive motor 20 has a function as a motor to be rotationally driven upon receiving the supply of power from the fuel cell stack 10 and the battery 40 and a function as a generator for generating electromotive power on opposite ends of the stator coil during the deceleration of the vehicle in which the rotor is rotated by an external force.

The inverter 30 is composed of a plurality of semiconductor switches such as IGBTs (Insulated Gate Bipolar Transistors). The semiconductor switches of the inverter 30 are controlled to be opened and closed by the controller 90, thereby converting direct-current power into alternating-current power or alternating-current power into direct-current power. The inverter 30 converts composite direct-current power of output power of the fuel cell stack 10 and output power of the battery 40 into three-phase alternating-current power and supplies it to the drive motor 20 when the drive motor 20 functions as the motor. On the other hand, the inverter 30 converts regenerative power (three-phase alternating-current power) of the drive motor 20 into direct-current power and supplies it to the battery 40 when the drive motor 20 functions as the generator.

The battery 40 is a secondary battery capable of charging and discharging. The battery 40 is charged with a surplus of the output power (output current×output voltage) of the fuel cell stack 10 and the regenerative power of the drive motor 20. The power charged into the battery 40 is supplied to various auxiliary machines 50 and the drive motor 20 if necessary.

The auxiliary machines 50 are, for example, a compressor for feeding the cathode gas under pressure to the fuel cell stack 10 and a PTC heater for heating the cooling water.

The DC/DC converter 60 is a bidirectional voltage converter for increasing and decreasing the output voltage of the fuel cell stack 10. By controlling the output voltage of the fuel cell stack 10 by the DC/DC converter 60, the output current and, consequently, the output power of the fuel cell stack 10 are controlled.

The internal resistance measuring device 70 is a device for measuring an internal resistance of the laminated battery 11 by causing an alternating current to flow into the laminated battery 11 of the fuel cell stack 10. The internal resistance is a total value of a resistance Rm of an electrolyte membrane (hereinafter, referred to as a "membrane resistance") of each fuel cell 1.

For highly efficient power generation of the fuel cell stack 10, a water content (degree of wetness) of the electrolyte membrane of the fuel cell 1 needs to be managed to a proper water content. The water content of the electrolyte membrane of the fuel cell 1 is known to be correlated with the membrane resistance Rm, i.e. the internal resistance of the laminated battery 11. Thus, the water content of the electrolyte membrane can be grasped by measuring the internal resistance of the laminated battery 11. The internal resistance measuring device 70 is described later with reference to FIG. 4.

The controller 90 is configured by a microcomputer including a central processing unit (CPU), a read-only memory (ROM), a random access memory (RAM) and an input/output interface (I/O interface). To the controller 90 are input output values from various sensors necessary to control the fuel cell system 100 besides output values from the current sensor 91, the voltage sensor 92 and the internal resistance measuring device 70 described above.

The controller 90 controls flow rates and pressures of the cathode gas and the anode gas and a flow rate and a temperature of the cooling water supplied to the fuel cell stack 10 and the like on the basis of these input signals. For example, the controller 90 controls the flow rate and the pressure of the cathode gas and the temperature of the cooling water supplied to the fuel cell stack 10 on the basis of the internal resistance measured by the internal resistance measuring device 70 so that the water content of the electrolyte membrane of the fuel cell 1 reaches a water content suitable for power generation.

Figure 4:
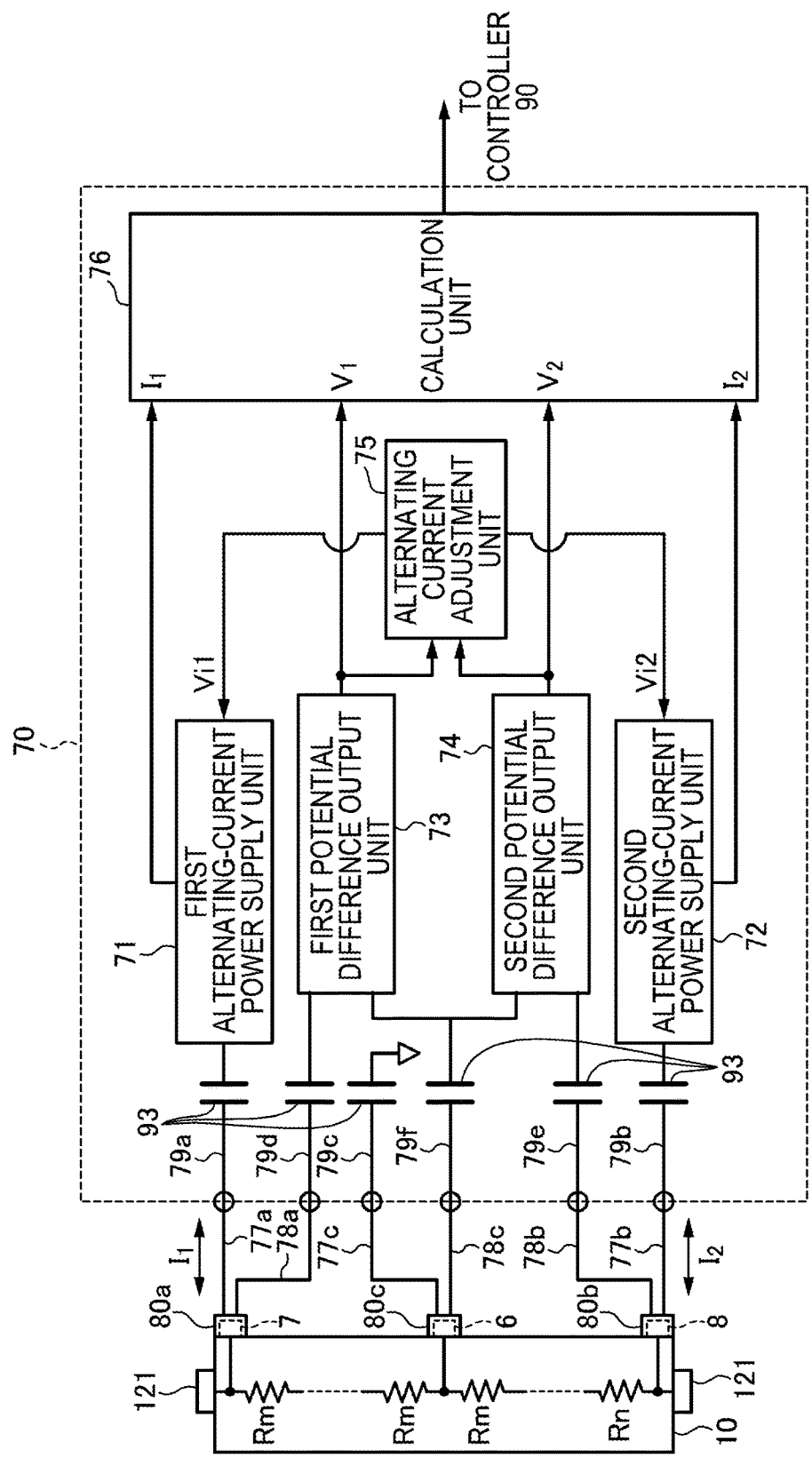
FIG. 4 is a diagram showing an internal resistance measuring device.

FIG. 4 is a diagram showing the internal resistance measuring device 70.

The internal resistance measuring device 70 includes a first alternating-current power supply unit 71, a second alternating-current power supply unit 72, a first potential difference output unit 73, a second potential difference output unit 74, an alternating current adjustment unit 75 and a calculation unit 76, and is connected to the fuel cell stack 10 via three source lines 77 and three sense lines 78.

The source lines 77 are electric wires for inputting and outputting alternating currents I1, I2 generated by the internal resistance measuring device 70 to and from the laminated battery 11 of the fuel cell stack 10. There are three source lines 77 composed of a positive electrode source line 77a, a negative electrode source line 77b and an intermediate source line 77c.

The sense lines 78 are electric wires for inputting each alternating-current potential generated by the positive electrode tab 7, the negative electrode tab 8 and the intermediate tab 6 to the internal resistance measuring device 70 when the alternating currents I1, I2 are input to or output from the laminated battery 11 of the fuel cell stack 10. There are three sense lines 78 composed of a positive electrode sense line 78a, a negative electrode sense line 78b and an intermediate sense line 78c.

One end side of the positive electrode source line 77a is connected to the first alternating-current power supply unit 71 via a first electric wire 79a. One end side of the negative electrode source line 77b is connected to the second alternating-current power supply unit 72 via a second electric wire 79b. One end side of the intermediate source line 77c is connected to a ground terminal serving as a reference potential point (0 [V]) via a third electric wire 79c.

One end side of the positive electrode sense line 78a is connected to the first alternating-current potential difference output unit 73 via a fourth electric wire 79d. One end side of the negative electrode sense line 78b is connected to the second potential difference output unit 74 via a fifth electric wire 79e. One end side of the intermediate sense line 78c is connected to each of the first and second potential difference output units 73, 74 via a sixth electric wire 79f.

On the other hand, the other end sides of the positive electrode source line 77a and the positive electrode sense line 78a are connected to the positive electrode tab 7 of the fuel cell stack 10 via a first connector 80a. The other end sides of the negative electrode source line 77b and the negative electrode sense line 78b are connected to the negative electrode tab 8 of the fuel cell stack 10 via a second connector 80b. The other end sides of the intermediate source line 77c and the intermediate sense line 78c are connected to the intermediate tab 6 via a third connector 80c. Each of the first, second and third connectors 80a, 80b and 80c is identically shaped.

Figure 5:
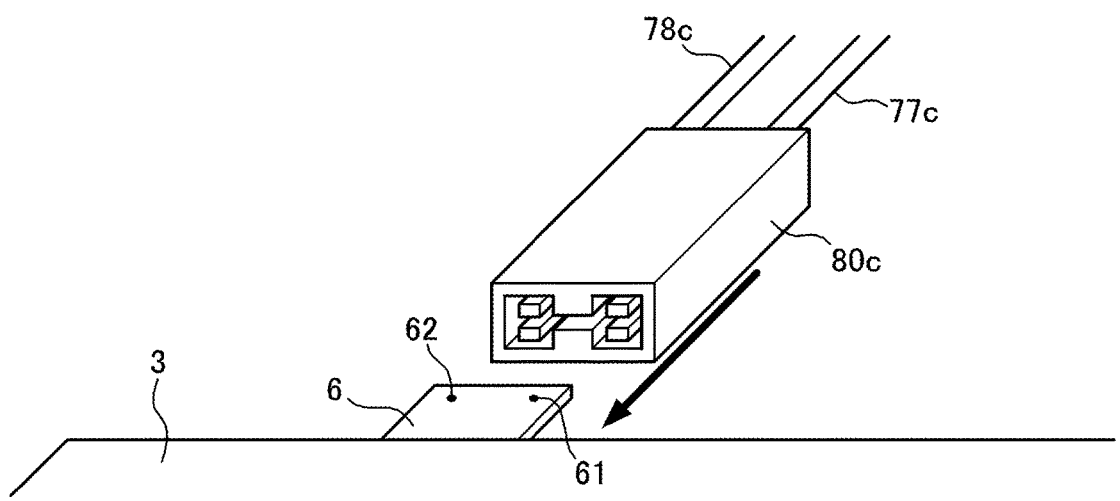
FIG. 5 is a diagram showing a method for connecting a source line and a sense line to each tab via each connector.

FIG. 5 is a diagram showing a method for connecting the intermediate source line 77c and the intermediate sense line 78c to the intermediate tab 6 via the third connector 80c. The positive electrode source line 77a and the positive electrode sense line 78a, the negative electrode source line 77b and the negative electrode sense line 78b are also respectively connected to the positive electrode tab 7 and the negative electrode tab 8 by similar methods.

As shown in FIG. 5, tips of the intermediate source line 77c and the intermediate sense line 78c are bundled by the third connector 80c and respectively separately connected to the intermediate tab 6 by fitting the third connector 80c to the intermediate tab 6. In the following description, a contact between the intermediate source line 77c and the intermediate tab 6 is referred to as an "intermediate source connection point 61" and a contact between the intermediate sense line 78c and the intermediate tab 6 is referred to as an "intermediate sense connection point 62".

As just described, the intermediate source line 77c and the intermediate sense line 78c are respectively connected to the intermediate tab 6 while being spaced apart by a predetermined distance. Specifically, the intermediate source line 77c and the intermediate sense line 78c are electrically connected to the intermediate tab 6 such that two connection points, i.e. the intermediate source connection point 61 and the intermediate sense connection point 62 are present on the intermediate tab 6 while being spaced apart.

Description is made with reference to FIG. 4 again.

Each of the electric wires from the first electric wire 79a to the sixth electric wire 79f is an internal wiring of the internal resistance measuring device 70. Each electric wire is provided with a direct current breaker 93 for cutting off a direct current and allowing only an alternating current to flow. Although a capacitor is used as the direct current breaker 93 in the present embodiment, a transformer or the like may also be used.

A first command voltage Vi1 output from the alternating current adjustment unit 75 is input to the first alternating-current power supply unit 71. The first alternating-current power supply unit 71 generates the alternating current I1 of a reference frequency fb flowing into the laminated battery 11 from the positive electrode tab 7 of the fuel cell stack 10 via the first electric wire 79a and the positive electrode source line 77a on the basis of the first command voltage Vi1. The first alternating-current power supply unit 71 is described in detail below with reference to FIG. 6.

Figure 6:
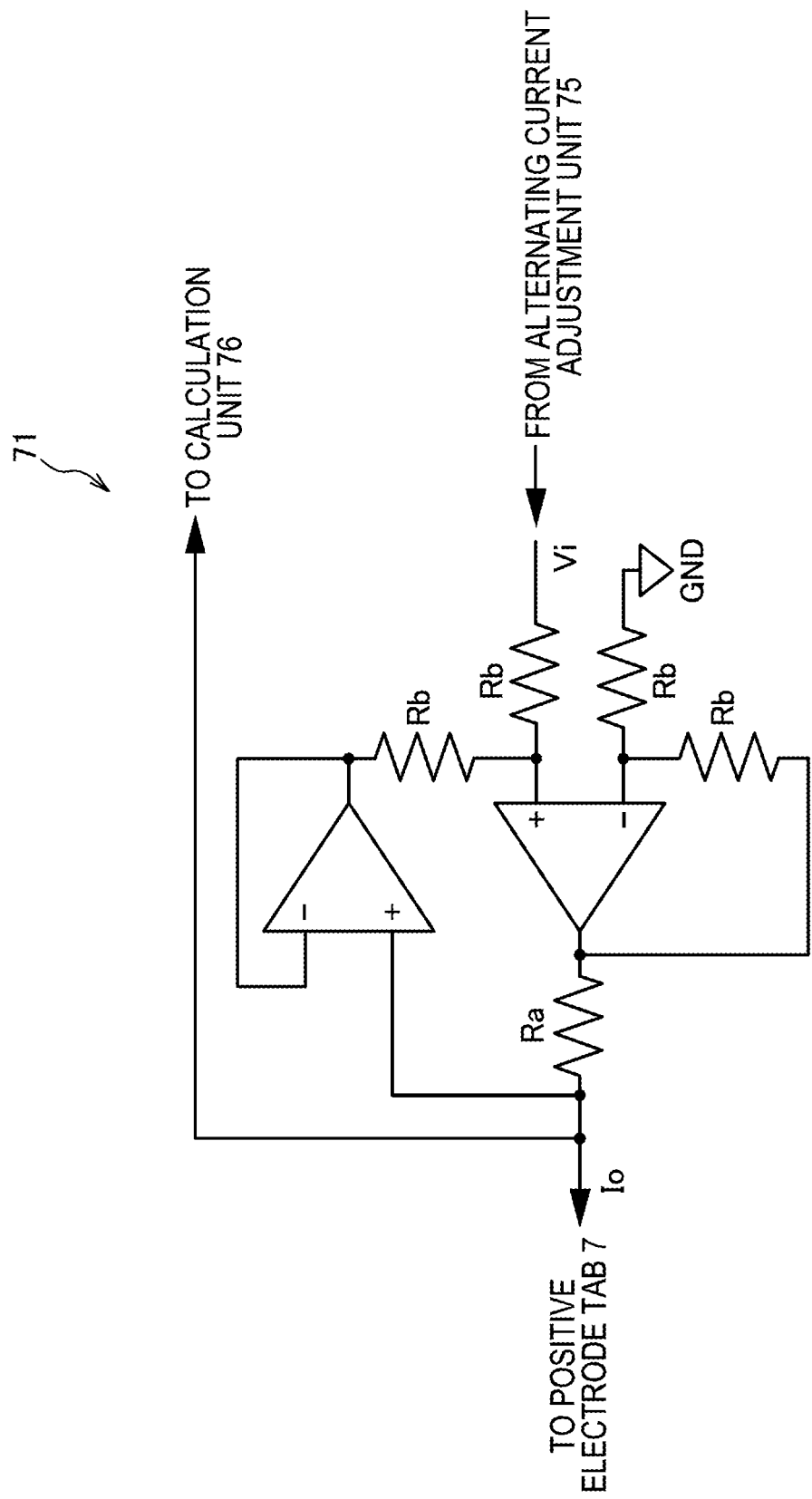
FIG. 6 is a diagram showing a first alternating-current power supply unit in detail.

FIG. 6 is a diagram showing the first alternating-current power supply unit 71 in detail.

As shown in FIG. 6, the first alternating-current power supply unit 71 is configured, for example, by a voltage-current conversion circuit using operational amplifiers. An output current Io of this voltage-current conversion circuit can be expressed by the following equation (1) using an input voltage Vi and a current sensing resistance Ra.

(Equation 1)

$$Io=Vi/Ra \qquad (1)$$

That is, this voltage-current conversion circuit outputs an output current corresponding to the magnitude of the first command voltage Vi1, which is an input voltage. As just described, the first alternating-current power supply unit 71 generates the alternating current I1 by changing the output current according to the first command voltage Vi1.

A second command voltage Vi2 output from the alternating current adjustment unit 75 is input to the second alternating-current power supply unit 72. The second alternating-current power supply unit 72 generates the alternating current I2 of the reference frequency fb flowing into the laminated battery 11 from the negative electrode tab 8 of the fuel cell stack 10 via the third electric wire 79c and the negative electrode source line 77b on the basis of the second command voltage Vi2. The second alternating-current power supply unit 72 is configured by a voltage-current conversion circuit similarly to the first alternating-current power supply unit 71.

To the first potential difference output unit 73 are input an alternating-current potential Vc of the positive electrode tab 7 (hereinafter, referred to as a "positive electrode sense potential") via the fourth electric wire 79d connected to the positive electrode sense line 78a and an alternating-current potential Vm of the intermediate tab 6 (hereinafter, referred to as an "intermediate sense potential") via the sixth electric wire 79f connected to the intermediate sense line 78c. The first potential difference output unit 73 outputs a potential difference V1 between the positive electrode sense potential Vc and the intermediate sense potential Vm (hereinafter, referred to as a "positive-electrode side alternating-current voltage").

To the second potential difference output unit 74 are input the intermediate sense potential Vm via the sixth electric wire 79f and an alternating-current potential Va of the negative electrode tab 8 (hereinafter, referred to as a "negative electrode sense potential") via the fifth electric wire 79e connected to the negative electrode sense line 78b. The second potential difference output unit 74 outputs a potential difference V2 between the intermediate sense potential Vm and the negative electrode sense potential Va (hereinafter, referred to as a "negative-electrode side alternating-current voltage").

The first and second potential difference output units 73, 74 are, for example, differential amplifiers (instrumentation amplifiers).

The positive-electrode side alternating-current voltage V1 and the negative-electrode side alternating-current voltage V2 are input to the alternating current adjustment unit 75. The alternating current adjustment unit 75 outputs the first command voltage Vi1 for the first alternating-current power supply unit 71 and the second command voltage Vi2 for the second alternating-current power supply unit 72 on the basis of these two input values. More specifically, the alternating current adjustment unit 75 adjusts amplitudes of the alternating currents I1, I2 output from the first and second alternating-current power supply units 71, 72 by adjusting the first and second command voltages Vi1 and Vi2 such that these two input values match.

To match the positive-electrode side alternating-current voltage V1 (V1=Vc−Vm) and the negative-electrode side alternating-current voltage V2 (V2=Vm−Va) means, in other words, to zero a difference between the positive electrode sense potential Vc and the negative electrode sense potential Va (V1−V2=Vc−Va). Specifically, if the positive-electrode side alternating-current voltage V1 and the negative-electrode side alternating-current voltage V2 are matched, a direct-current output voltage of the fuel cell stack 10 itself does not vary even if the alternating currents are input and output to and from the laminated battery 11 by the internal resistance measuring device 70. Thus, it can be suppressed that the operations of the drive motor 20 and the like using the fuel cell stack 10 as a power source are affected by the input and output of the alternating currents. The alternating current adjustment unit 75 is described in detail below with reference to FIG. 7.

Figure 7:
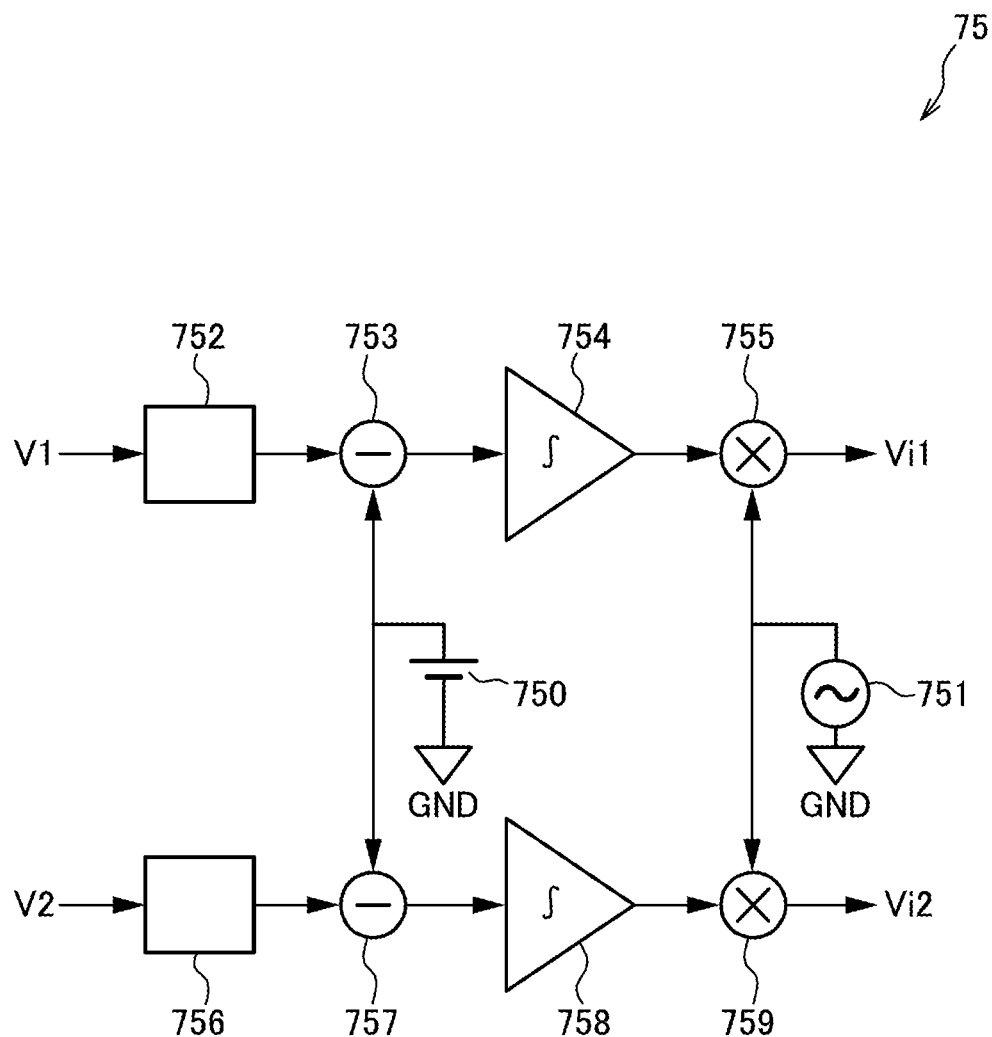
FIG. 7 is a diagram showing an alternating current adjustment unit in detail.

FIG. 7 is a diagram showing the alternating current adjustment unit 75 in detail.

As shown in FIG. 7, the alternating current adjustment unit 75 includes a reference voltage source 750, an alternating-current signal source 751, a first detector circuit 752, a first subtractor 753, a first integration circuit 754, a first multiplier 755, a second detector circuit 756, a second subtractor 757, a second integration circuit 758 and a second multiplier 759.

The reference voltage source 750 is a constant voltage source for generating a predetermined potential difference (hereinafter, referred to as a "reference voltage") Vs determined on the basis of zero [V]. It should be noted that the reference voltage Vs is a target value of the positive-electrode side alternating-current voltage V1 and the negative-electrode side alternating-current voltage V2. The alternating current adjustment unit 75 is a PI control circuit for converging the positive-electrode side alternating-current voltage V1 and the negative-electrode side alternating-current voltage V2 to this reference voltage Vs.

The alternating-current signal source 751 is a power source for generating a small-amplitude alternating-current signal of the reference frequency fb to be input to the first and second multipliers 755, 759.

The positive-electrode side alternating-current voltage V1 is input to the first detector circuit 752. The first detector circuit 752 converts the positive-electrode side alternating-current voltage V1 into a direct-current voltage V1d and outputs the direct-current voltage V1d. The first detector circuit 752 outputs, for example, an effective or average value of the positive-electrode side alternating-current voltage V1 as the direct-current voltage V1d of the positive-electrode side alternating-current voltage V1.

The direct-current voltage V1d output from the first detector circuit 752 and the reference voltage Vs are input to the first subtractor 753. The first subtractor 753 outputs a voltage difference between the direct-current voltage V1d and the reference voltage Vs.

The voltage difference output from the first subtractor 753 is input to the first integration circuit 754. The first integration circuit 754 outputs an integrated value of the input voltage difference.

The integrated value output from the first integration circuit 754 and the alternating-current signal output from the alternating-current signal source 751 are input to the first multiplier 755. The first multiplier 755 outputs the product of the input integrated value and the alternating-current signal as the first command voltage Vi1 to be input to the first alternating-current power supply unit 71. The first command voltage Vi1 is a command value for causing the alternating current for converging the positive-electrode side alternating-current voltage V1 to the reference voltage Vs to be output from the first alternating-current power supply unit 71.

The negative-electrode side alternating-current voltage V2 is input to the second detector circuit 756. The second detector circuit 756 converts the negative-electrode side alternating-current voltage V2 into a direct-current voltage V2d and outputs the direct-current voltage V2d. The second detector circuit 756 outputs, for example, an effective or average value of the negative-electrode side alternating-current voltage V2 as the direct-current voltage V2d of the negative-electrode side alternating-current voltage V2.

The direct-current voltage V2d output from the second detector circuit 756 and the reference voltage Vs are input to the second subtractor 757. The second subtractor 757 outputs a voltage difference between the direct-current voltage V2d and the reference voltage Vs.

The voltage difference output from the second subtractor 757 is input to the second integration circuit 758. The second integration circuit 758 outputs an integrated value of the input voltage difference.

The integrated value output from the second integration circuit 758 and the alternating-current signal output from the alternating-current signal source 751 are input to the second multiplier 759. The second multiplier 759 outputs the product of the input integrated value and the alternating-current signal as the second command voltage Vi2 to be input to the second alternating-current power supply unit 72. The second command voltage Vi2 is a command value for causing the alternating current capable of converging the negative-electrode side alternating-current voltage V2 to the reference voltage Vs to be output from the second alternating-current power supply unit 72.

The alternating currents I1, I2, the positive-electrode side alternating-current voltage V1 and the negative-electrode side alternating-current voltage V2 are input to the calculation unit 76. The calculation unit 76 calculates the internal resistance of the laminated battery 11 of the fuel cell stack 10 by substituting these four input values into the following Equation (2) and outputs a calculation result to the controller 90.

[Equation 2]

$$R = \frac{V1}{I1} + \frac{V2}{I2} \quad (2)$$

where R: internal resistance.

As just described, the internal resistance measuring device 70 according to the present embodiment measures the internal resistance of the laminated battery 11 by an alternating current bridge method. Specifically, an alternating current is caused to flow into the laminated battery 11 and adjusted such that the positive-electrode side alternating-current voltage V1 and the negative-electrode side alternating-current voltage V2 match, and the internal resistance of the laminated battery 11 is calculated on the basis of the adjusted alternating currents and alternating-current voltages.

Methods for measuring the internal resistance of the laminated battery 11 include, for example, a method for superimposing a high-frequency alternating current with a small amplitude on an output current of the fuel cell stack 10 by controlling the DC/DC converter 60 and measuring the internal resistance by dividing a voltage amplitude at that time by the current amplitude of the superimposed alternating current, besides the alternating current bridge method. In the case of this method, it suffices to provide the positive electrode tab 7 and the negative electrode tab 8 or two terminals (e.g. power extraction terminals 121) corresponding to those as terminals for inputting and outputting the alternating currents.

In contrast, in the case of measuring the internal resistance of the laminated battery 11 by the alternating current bridge method, three terminals are necessary as those for inputting and outputting alternating currents. Specifically, the intermediate tab 6 is necessary besides the positive electrode tab 7 and the negative electrode tab 8. As just described, in the case of measuring the internal resistance of the laminated battery 11 by the alternating current bridge method, the alternating currents also need to be input and output to and from the intermediate tab 6. It was found that an error might be caused between an actual internal resistance of the laminated battery 11 and an internal resistance measured by the internal resistance measuring device 70 due to this. The reason for that is described using an intermediate separator 300 according to a comparative example shown in FIG. 21.

Figure 21:
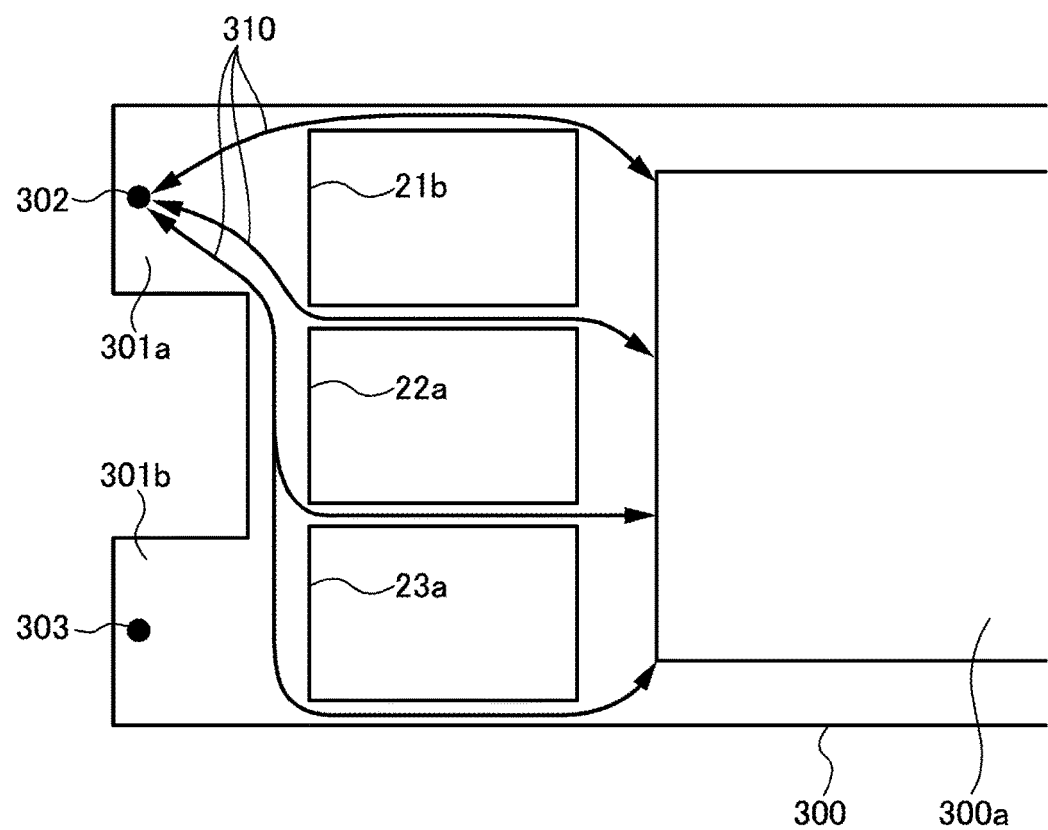
FIG. 21 is a schematic diagram showing a part of an intermediate separator according to a comparative example.

FIG. 21 is a schematic diagram showing a part of the intermediate separator 300 according to the comparative example.

The intermediate separator 300 according to the comparative example shown in FIG. 21 differs from the intermediate separator 3 according to the present embodiment in that one intermediate tab 301a for connecting the intermediate source line 77c and one intermediate tab 301b for connecting the intermediate sense line 78c are respectively provided on a short side of the intermediate separator 300.

When alternating currents are input and output via an intermediate source connection point 302 of the intermediate tab 301a to measure the internal resistance of the laminated battery 11 as shown in FIG. 21, alternating current paths (source current paths) 310 are formed between the intermediate source connection point 302 and a power generation region 300a.

At this time, in the intermediate separator 300 according to the comparative example, each manifold 21b, 22a 23a is interposed between the intermediate source connection point 302 and the power generation region 300a and a distance from the intermediate source connection point 302 to the power generation region 300a is long. Thus, a plurality of alternating current paths 310 are formed in a dispersed manner. As a result, current paths 310 are also formed between an intermediate sense connection point 303 and the power generation region 300a and a voltage drop is caused on these current paths due to a resistance of the intermediate separator 300 itself (hereinafter, referred to as a "separator resistance"). That is, an intermediate sense potential Vm, which is a potential of the intermediate sense connection point 304, is affected by the voltage drop due to the separator resistance to cause an error between the intermediate sense potential Vm and a potential of the power generation region 300a.

The intermediate sense potential Vm is input to the first and second potential difference output units 73, 74 via the intermediate sense line 78c and used for the calculation of the positive-electrode side alternating-current voltage V1 and the negative-electrode side alternating-current voltage V2. Accordingly, if the intermediate sense potential Vm is affected by the voltage drop due to the separator resistance to become a potential different from the potential of the power generation region 300a, the positive-electrode side alternating-current voltage V1 and the negative-electrode side alternating-current voltage V2 include not only a voltage drop due to the membrane resistance Rm of the electrolyte membrane to be measured, but also the voltage drop due to the separator resistance. As a result, an error is caused between an internal resistance calculated by the calculation unit 76 and an actual internal resistance.

Further, if it is attempted to provide two intermediate tabs 301a, 301b as on the intermediate separator 300 according to the comparative example shown in FIG. 21, manufacturing man-hours and manufacturing cost of the intermediate separator 300 increase. Thus, it is desired to provide only one intermediate tab 6 as on the intermediate separator 3 according to the present embodiment.

However, if the intermediate source line 77c and the intermediate sense line 78c are connected to one intermediate tab 6 as in the present embodiment, the effect of the voltage drop due to the separator resistance spreads depending on a position where the intermediate tab 6 is provided. The reason for that is described below using an intermediate separator 400 according to a comparative example shown in FIG. 22.

Figure 22:
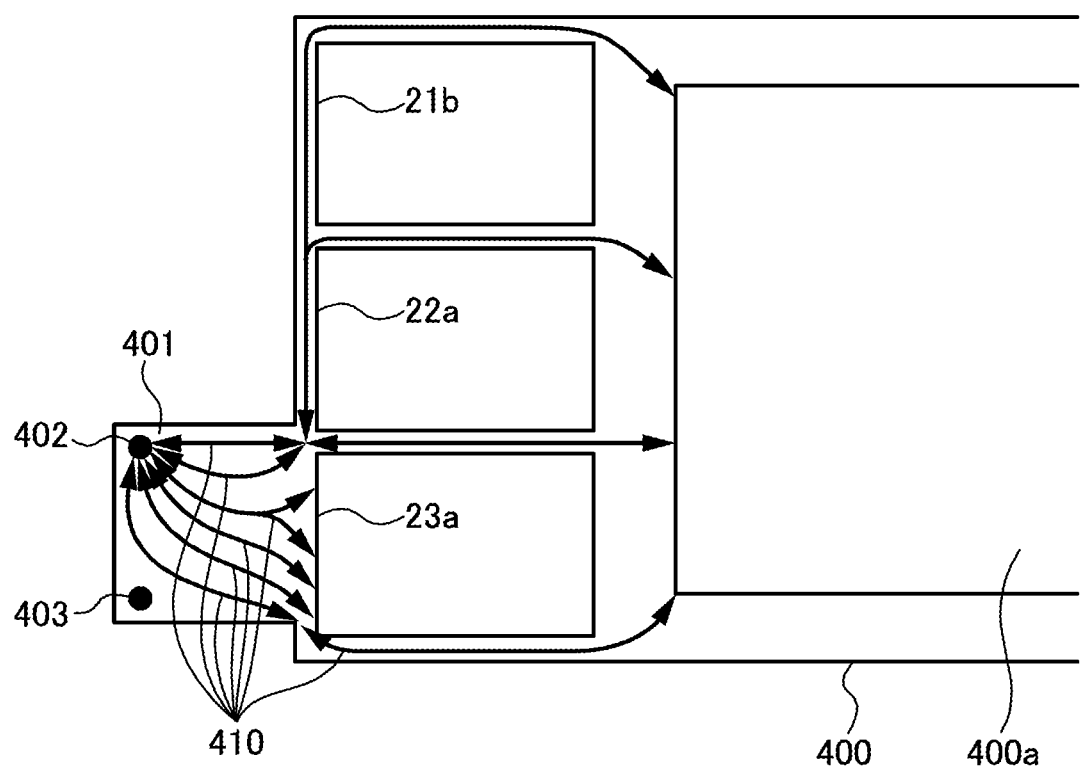
FIG. 22 is a schematic diagram showing a part of an intermediate separator according to a comparative example.

FIG. 22 is a schematic diagram showing a part of the intermediate separator 400 according to the comparative example.

The intermediate separator 400 according to the comparative example shown in FIG. 22 differs from the intermediate separator 3 according to the present embodiment in that one intermediate tab 401 for connecting the intermediate source line 77c and the intermediate sense line 78c is provided on a short side of the intermediate separator 400.

Also on this intermediate separator 400 according to the comparative example, when alternating currents are input and output via an intermediate source connection point 402 of the intermediate tab 401, alternating current paths 410 are formed between the intermediate source connection point 402 and a power generation region 400a. At this time, if it is attempted to connect the intermediate source line 77c and the intermediate sense line 78c to the one intermediate tab 401, the intermediate source connection point 402 and an intermediate sense connection point 403 need to be closer.

As a result, the intermediate sense potential Vm is largely affected by a voltage drop due to a separator resistance caused on the current paths 410 and an error between the intermediate sense potential Vm and a potential of the power generation region 400a is enlarged.

Particularly, at present, the thinning of the electrolyte membranes and each separator 3, 4 is in progress for high efficiency and miniaturization of the fuel cell stack 10. Since the fuel cell 1 itself can be thinned by thinning the electrolyte membrane and each separator 3, 4, the fuel cell stack 10 can be miniaturized. Further, since the membrane resistance Rm can be reduced by thinning the electrolyte membrane, high efficiency of the fuel cell stack 10 can be realized. However, the separator resistance increases as each separator 3, 4 is thinned.

That is, if the thinning of the electrolyte membrane and each separator 3, 4 progresses, the membrane resistance Rm of the electrolyte membrane is reduced, whereas the separator resistance increases. Thus, as the thinning of the electrolyte membrane and each separator 3, 4 progresses, the voltage drop due to the separator resistance becomes increasingly non-negligible.

Accordingly, in the present embodiment, the measurement accuracy of the internal resistance measuring device 70 is improved by avoiding as much as possible that the intermediate sense potential Vm, which is the potential of the intermediate sense connection point 62, is affected by the voltage drop due to the separator resistance. This method is described below with reference to FIGS. 8 to 10.

Figure 8:
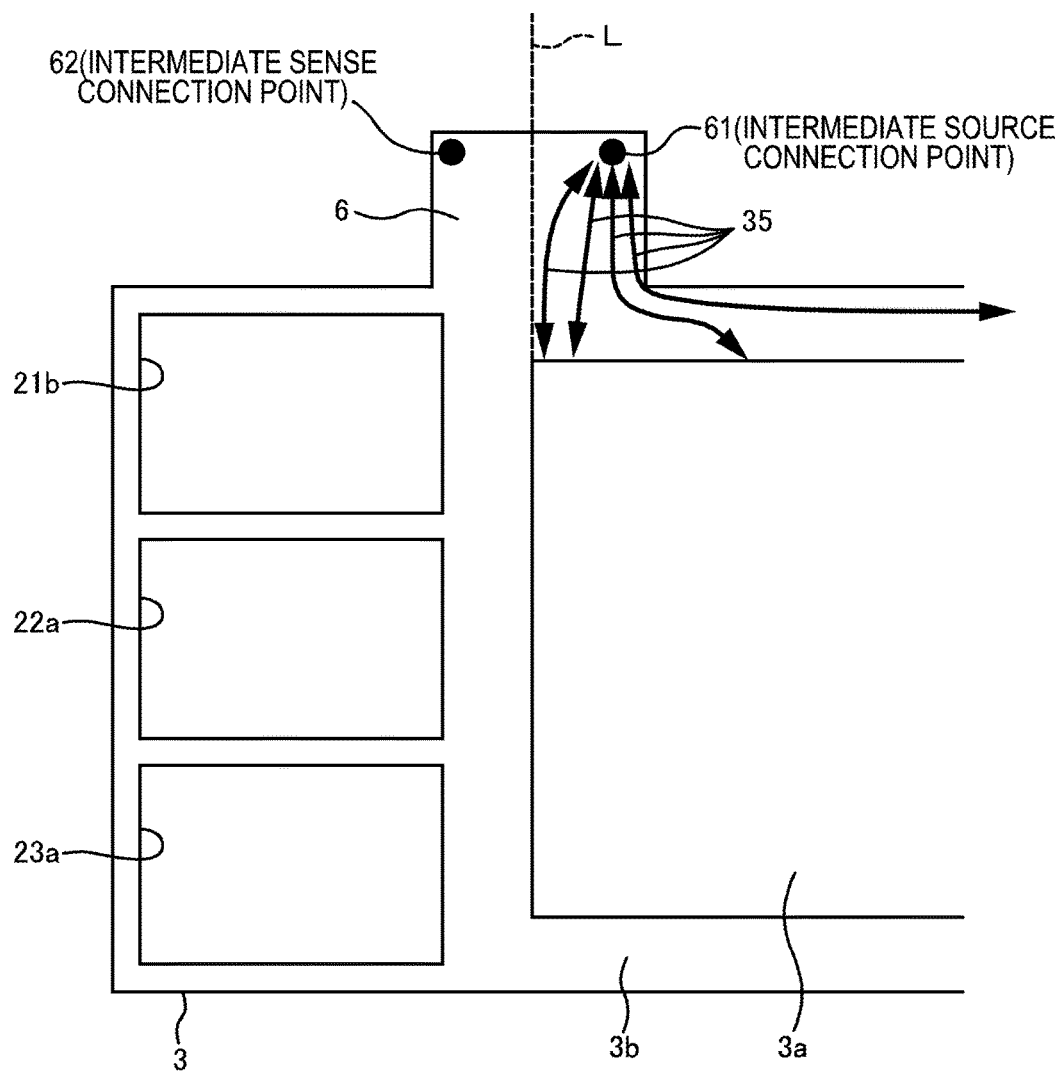
FIG. 8 is a schematic diagram showing a part of an intermediate separator according to the first embodiment of the present invention.
Figure 9:
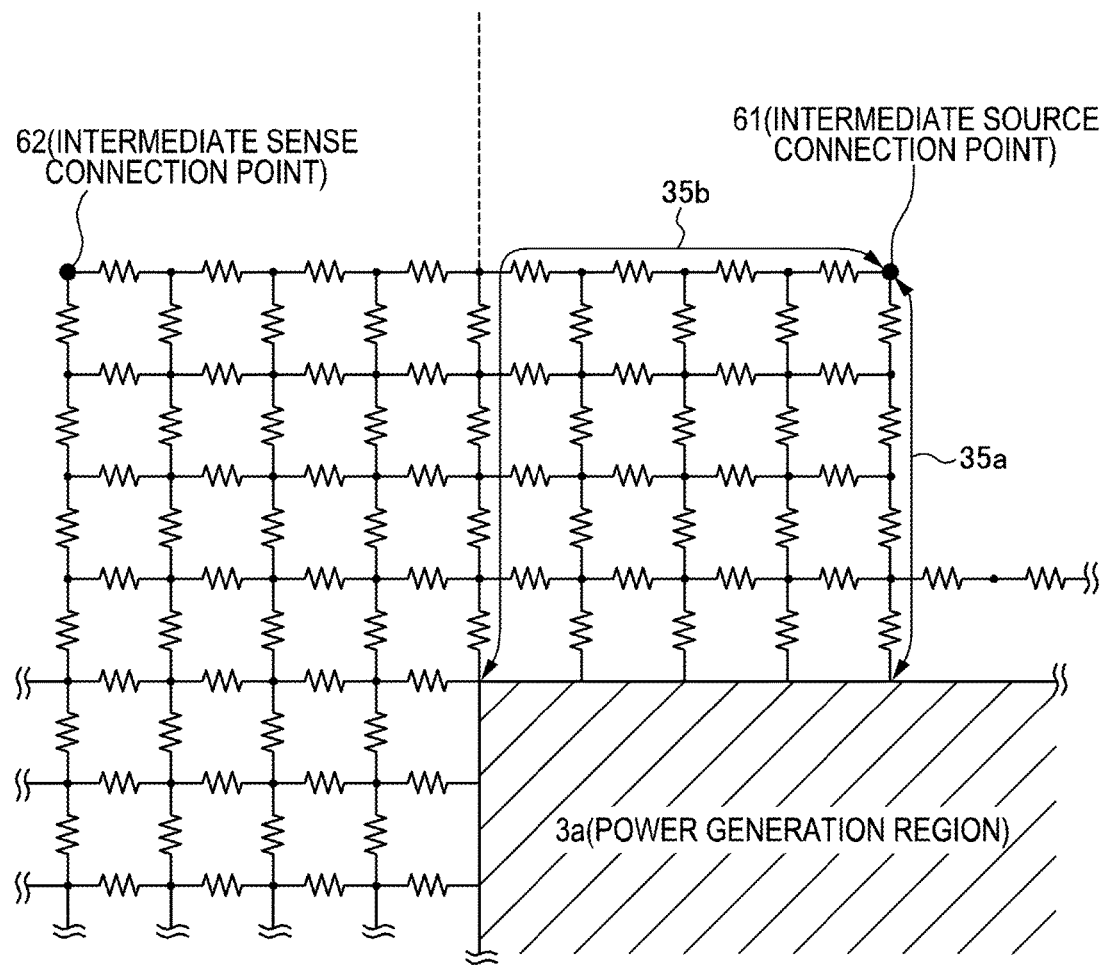
FIG. 9 is a diagram schematically showing a non-power generation region of the intermediate separator according to the first embodiment of the present invention as an electric circuit.

FIG. 8 is a schematic diagram of a part of the intermediate separator 3 according to the present embodiment showing flows of alternating currents input and output to and from the intermediate tab 6. FIG. 9 is a diagram schematically showing the non-power generation region 3b of the intermediate separator 3 as an electric circuit.

When directions of alternating currents are positive, the alternating currents input from the positive electrode tab 7 and the negative electrode tab 8 flow through the laminated battery 11 and reach the power generation region 3a of the intermediate separator 3. Then, as shown in FIG. 8, the alternating currents having reached the power generation region 3a flow into the non-power generation region 3b of the intermediate separator 3 and are output from the intermediate source connection point 61. At this time, a voltage drop due to the separator resistance occurs on current paths 35 of the alternating currents flowing on the non-power generation region 3b from the power generation region 3a to the intermediate source connection point 61 (hereinafter, referred to as "source current paths"). It should be noted that the alternating current flow in an opposite direction when the directions thereof are negative.

Here, as shown in FIG. 9, the non-power generation region 3b of the intermediate separator can be expressed as an electric circuit in which resistors are distributed in a lattice. As also shown in FIG. 8, a plurality of source current paths 35 are formed between the power generation region 3a and the intermediate source connection point 61.

As can be understood from FIG. 9, when the source current path 35a having a short distance from the power generation region 3a to the intermediate source connection point 61 and the source current path 35b having a long distance are, for example, compared, the source current path 35a having a short distance has a lower total resistance on the source current path 35. Thus, more alternating currents flow along the source current path 35a having a short distance from the power generation region 3a to the intermediate source connection point 61.

Figure 10:
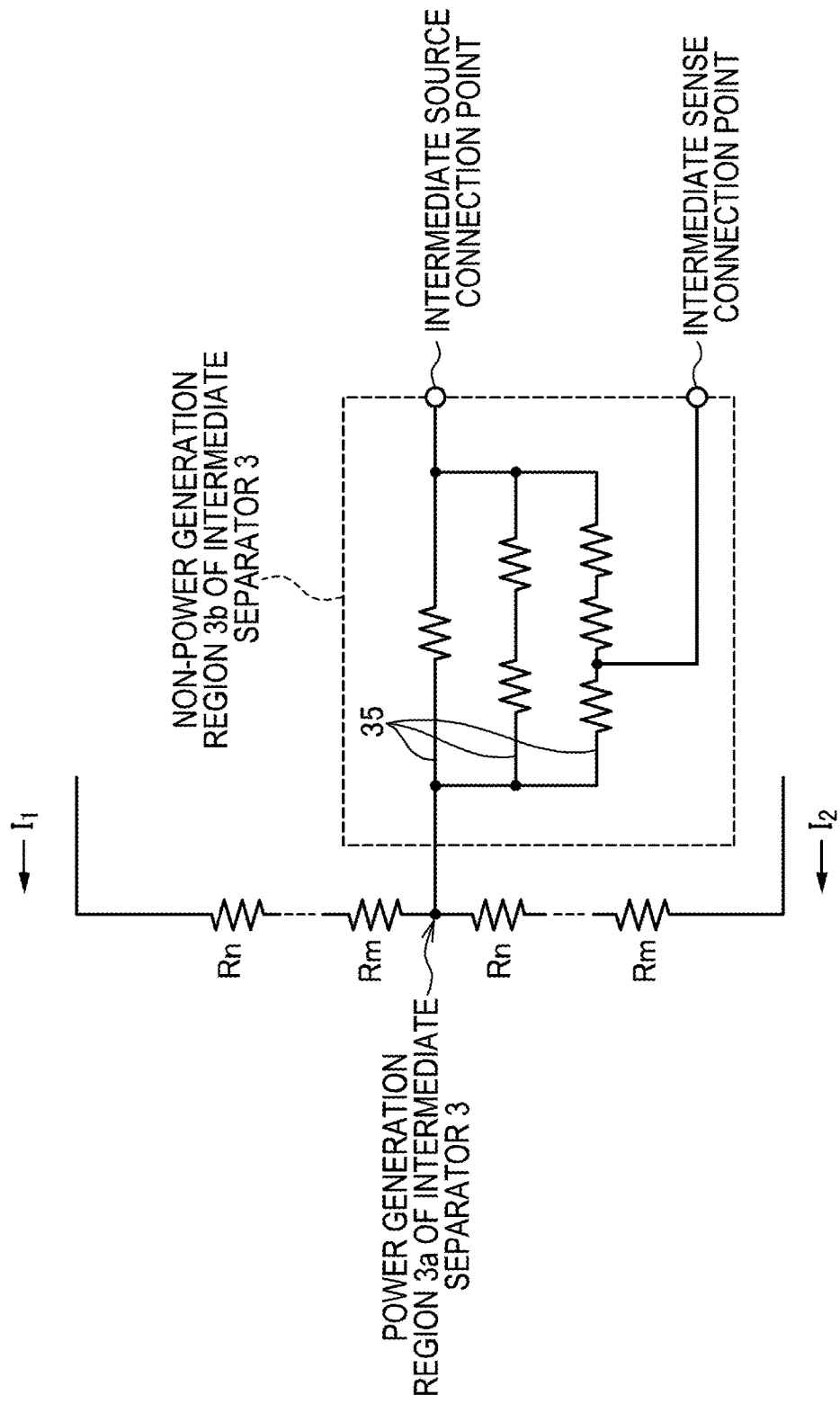
FIG. 10 is a diagram schematically showing source current paths 35 as a simpler electric circuit.

FIG. 10 schematically shows the source current paths 35 as a simpler electric circuit.

As described above, the plurality of source current paths 35 are formed between the power generation region 3a and the intermediate source connection point 61 and the amount of the current flowing along each source current path 35 changes according to a length of each source current path 35 (total resistance on each source current path 35).

Here, in the present embodiment, the intermediate source connection point 61 and the intermediate sense connection point 62 are separately provided on the intermediate tab 6, the alternating currents are input and output to and from the intermediate source connection point 61 and the potential of the intermediate sense connection point 62 (intermediate sense potential Vm) is input to the first and second potential difference output units 73, 74.

Accordingly, by arranging the intermediate sense connection point 62 at such a position that the source current paths 35 formed between the intermediate source connection point 61 and the power generation region 3a are hardly present, i.e. such a position that the total resistance on the source current path 35 is large and the alternating currents hardly flow, the intermediate sense potential Vm is hardly affected by the voltage drop due to the separator resistance.

Thus, in the present embodiment, the intermediate sense connection point 62 is arranged at a position distant from the source current paths 35 to be separated from the source current paths 35.

Specifically, as shown in FIG. 8, the intermediate tab 6 is so formed that a distance from the power generation region 3a to the intermediate sense connection point 62 is longer than a distance from the power generation region 3a to the intermediate source connection point 61. Specifically, the intermediate tab 6 is so formed on the long side of the intermediate separator 3 that the intermediate source connection point 61 is located on the side of the power generation region 3a and the intermediate sense connection point 62 is located on a side opposite to the power generation region 3a with respect to an extension line L extending along the short side direction of the intermediate separator 3 from one end of the power generation region 3a.

By distancing the intermediate sense connection point 62 from the power generation region 3a and locating the intermediate source connection point 61 close to the power generation region 3a, the intermediate sense connection point 62 can be distanced from the source current paths 35 and separated from the source current paths 35. Thus, the intermediate sense potential Vm is less likely to be affected by the voltage drop due to the separator resistance and the measurement accuracy of the internal resistance measuring device 70 can be improved.

The intermediate separator 3 according to the present embodiment described above is a separator of the fuel cell 1 laminated while sandwiching the MEA 2a forming the power generation region 3a. The intermediate separator 3 includes the intermediate tab 6 (source connection point tab) for inputting and outputting alternating currents for internal resistance measurement and the intermediate tab 6 (sense connection point tab) for detecting potentials of the alternating currents input and output to and from the intermediate tab 6 (source connection point tab).

The intermediate separator 3 also includes separation portion configured to separate the intermediate tab 6 (sense connection point tab) in a part including the intermediate sense connection point 62 from the source current paths 35 of the alternating currents for internal resistance measurement from the intermediate tab 6 (source connection point tab) to the power generation region 3a. In the present embodiment, the separation portion, as one mode, includes the arrangement of the intermediate tab 6 (sense connection point tab) in the part including the intermediate sense connection point 62 at a position distant from the source current paths 35.

By separating the intermediate tab 6 (sense connection point tab) in the part including the intermediate sense connection point 62 from the source current paths 35 of the alternating currents formed between the intermediate source connection point 61 and the power generation region 3a, the effect of the voltage drop between the intermediate source connection point 61 and the power generation region 3a on the potential of the intermediate sense connection point 62 can be eliminated. Specifically, a potential difference between the intermediate sense potential Vm, which is the potential of the intermediate sense connection point 62, and the potential of the power generation region 3a can be reduced. Thus, an error between an internal resistance calculated by the internal resistance measuring device 70 and an actual internal resistance becomes smaller, wherefore the measurement accuracy of the internal resistance measuring device 70 can be improved.

Further, in the intermediate separator 3 according to the present embodiment, the intermediate tab 6 (source connection point tab) in the part including the intermediate source connection point 61 and the intermediate tab 6 (sense connection point tab) in the part including the intermediate sense connection point 62 are connected into one tab.

Since this makes it sufficient to provide the intermediate separator 3 with one intermediate tab 6 in connecting the intermediate source line 77c and the intermediate sense line 78c to the intermediate separator 3, man-hours required for processing and a cost increase can be suppressed to minimum levels.

Further, the laminated battery 11 according to the present embodiment includes the alternating-current power supply units 71, 72 connected to an internal resistance measurement object at least including the laminated battery 11, in which the fuel cells 1 are laminated, and configured to output alternating currents to the internal resistance measurement object, the alternating current adjustment unit 75 for adjusting the alternating currents so that the positive electrode side alternating-current potential difference (positive-electrode side alternating-current voltage V1), which is a difference between the potential on the positive electrode of the internal resistance measurement object (positive electrode sense potential Vc) and the potential of the intermediate part (intermediate sense potential Vm) and the negative-electrode side alternating-current potential difference (negative-electrode side alternating-current voltage V2), which is a difference between the potential on the negative electrode of the internal resistance measurement object (negative electrode sense potential Va) and the potential of the intermediate part (intermediate sense potential Vm) match, and the calculation unit 76 for calculating the internal resistance of the laminated battery 11 on the basis of the adjusted alternating currents and alternating-current potential differences.

The fuel cell 1 includes the separators 3, 4 and the MEA 2a interposed between the separators 3, 4 and forming the power generation region. The intermediate separator 3 includes the intermediate tab 6 (source connection point tab) for inputting and outputting the alternating currents to and from the alternating current adjustment unit 75, the intermediate tab 6 (sense connection point tab) for detecting the potentials of the alternating currents inputted and outputted to and from the intermediate tab 6 (source connection point tab) and the separation portion configured to separate the intermediate tab 6 (sense connection point tab) from the source current paths 35 of the alternating currents from the intermediate tab 6 (source connection point tab) to the power generation region 3a.

This can eliminate the effect of the voltage drop between the intermediate source connection point 61 and the power generation region 3a on the potential of the intermediate sense connection point 62. Specifically, the potential difference between the intermediate sense potential Vm, which is the potential of the intermediate sense connection point 62, and the potential of the power generation region 3a can be reduced. Thus, an error between an internal resistance calculated by the internal resistance measuring device 70 and an actual internal resistance is reduced, wherefore the measurement accuracy of the internal resistance measuring device 70 can be improved.

Further, the connection method of the internal resistance measuring device 70 according to the present embodiment is such that the intermediate sense line 78c is connected at a position distant from the source current paths 35 of the alternating currents formed between the connecting portion (intermediate source connection point) 61 of the intermediate source line 77c and the power generation region 3a.

This can eliminate the effect of the voltage drop between the intermediate source connection point 61 and the power generation region 3a on the potential of the intermediate sense connection point 62. Specifically, the potential difference between the intermediate sense potential Vm, which is the potential of the intermediate sense connection point 62, and the potential of the power generation region 3a can be reduced. Thus, an error between an internal resistance calculated by the internal resistance measuring device 70 and an actual internal resistance is reduced, wherefore the measurement accuracy of the internal resistance measuring device 70 can be improved.

(Second Embodiment)

Next, a second embodiment of the present invention is described with reference to FIG. 11. The second embodiment of the present invention differs from the first embodiment in the shape of an intermediate tab 6. The following description is centered on that point of difference. It should be noted that, in each of the following embodiments, parts having the same functions as in the aforementioned first embodiment are denoted by the same reference signs and repeated description is omitted as appropriate.

Figure 11:
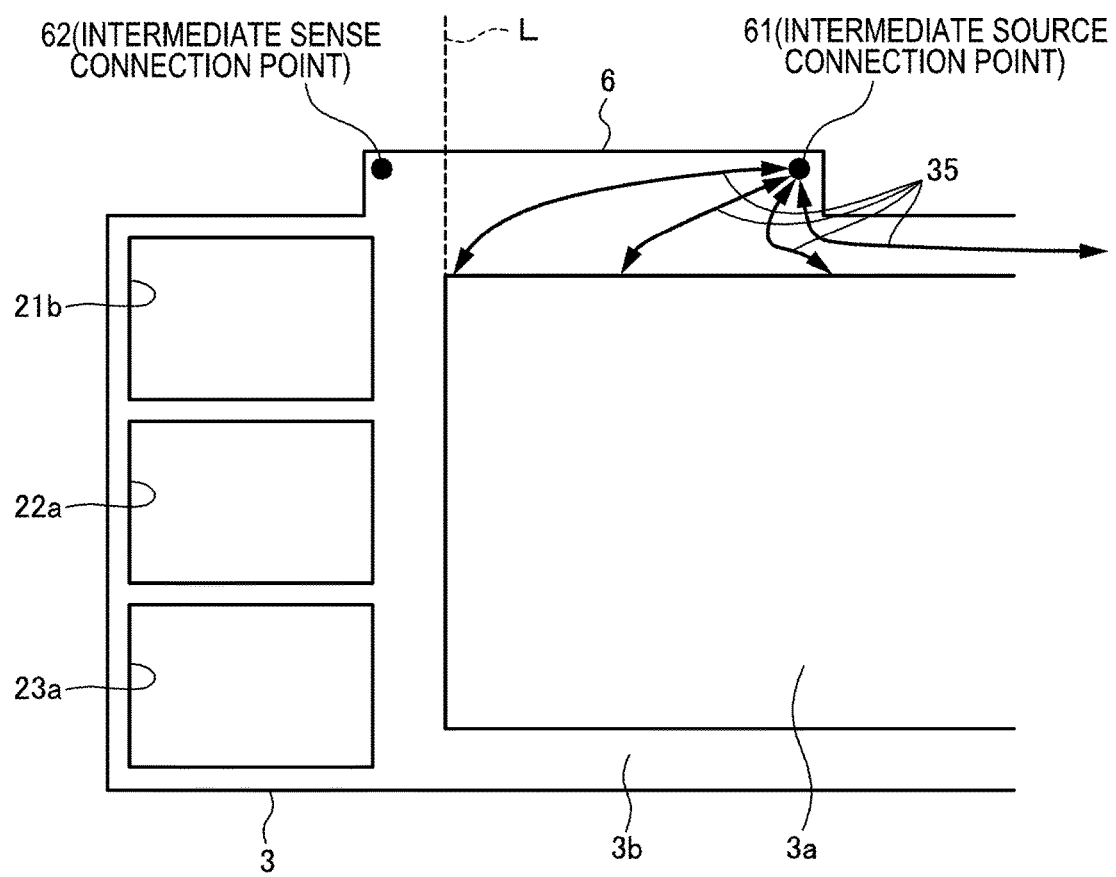
FIG. 11 is a schematic diagram showing a part of an intermediate separator according to a second embodiment of the present invention.

FIG. 11 is a schematic diagram of a part of an intermediate separator 3 according to the present embodiment showing flows of alternating currents input and output to and from the intermediate tab 6.

As shown in FIG. 11, in the present embodiment, a vertical width (projecting width from the separator) of the intermediate tab 6 is shorter than in the first embodiment and a lateral width of the intermediate tab 6 is widened toward a power generation region 3a.

This enables an intermediate source connection point 61 to be closer to the power generation region 3a and a distance between the intermediate source connection point 61 and the power generation region 3a to be shorter than in the first embodiment. Thus, more currents can flow along source current paths 35 having a short distance from the power generation region 3a to the intermediate source connection point 61, wherefore the alternating currents flowing at a position where an intermediate sense connection point 62 is arranged can be made relatively less.

Thus, an intermediate sense potential Vm is less likely to be affected by a separator resistance, wherefore the measurement accuracy of an internal resistance measuring device 70 can be improved.

According to the present embodiment described above, effects similar to those of the aforementioned first embodiment are obtained. Further, the alternating currents flowing at the position where the intermediate sense connection point 62 is arranged can be reduced more than in the first embodiment. Thus, the measurement accuracy of the internal resistance measuring device 70 can be improved more than in the first embodiment.

(Third Embodiment)

Next, a third embodiment of the present invention is described with reference to FIG. 12. The third embodiment of the present invention differs from the first embodiment in the shape of an intermediate tab 6. The following description is centered on that point of difference.

Figure 12:
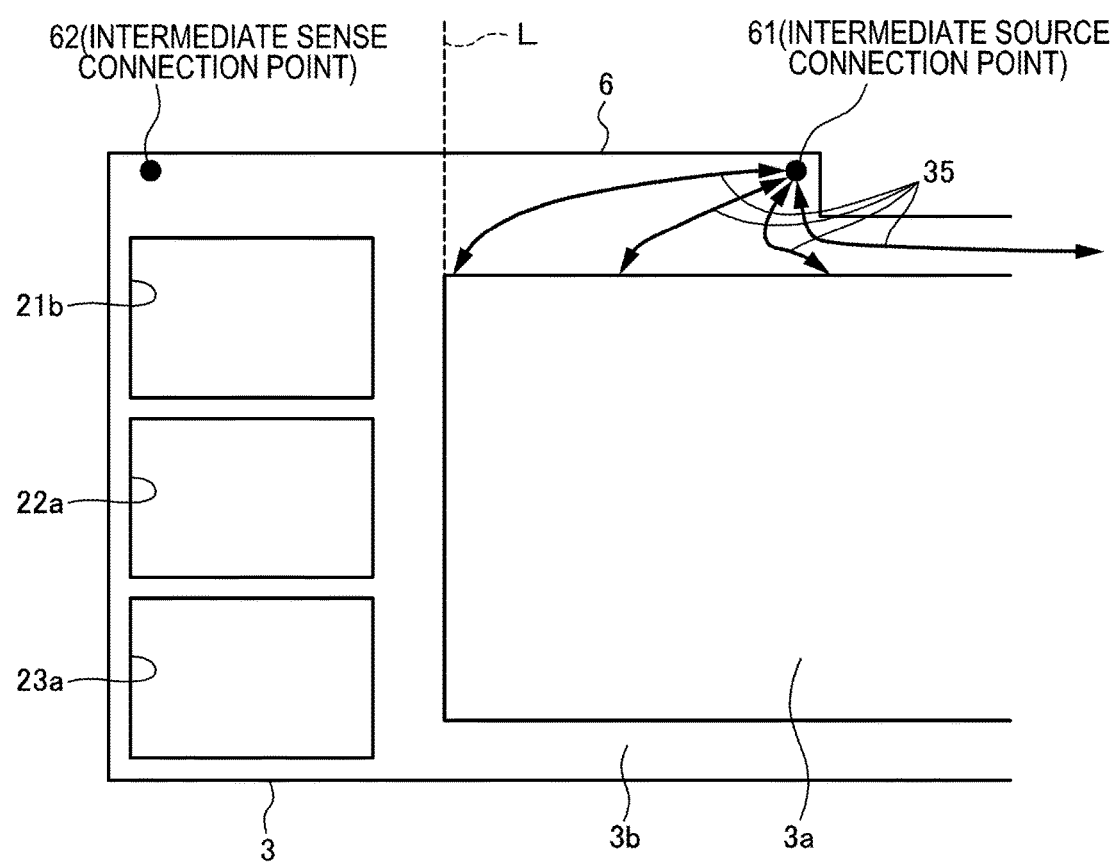
FIG. 12 is a schematic diagram showing a part of an intermediate separator according to a third embodiment of the present invention.

FIG. 12 is a schematic diagram of a part of an intermediate separator 3 according to the present embodiment showing flows of alternating currents input and output to and from the intermediate tab 6.

As shown in FIG. 12, in the present embodiment, a vertical width (projecting width from the separator) of the intermediate tab 6 is shorter than in the first embodiment and a lateral width of the intermediate tab 6 is widened toward a non-power generation region 3b.

This enables an intermediate sense connection point 62 to be more distanced from the power generation region 3a and a distance between the intermediate sense connection point 62 and the power generation region 3a to be longer than in the first embodiment. Thus, alternating currents are less likely to flow to a position where the intermediate source connection point 62 is arranged.

Thus, an intermediate sense potential Vm is less likely to be affected by a separator resistance, wherefore the measurement accuracy of an internal resistance measuring device 70 can be improved.

According to the present embodiment described above, effects similar to those of the aforementioned first embodiment are obtained. Further, the alternating currents are less likely to flow to the position where the intermediate sense connection point 62 is arranged than in the first embodiment. Therefore, the measurement accuracy of the internal resistance measuring device 70 can be improved more than in the first embodiment.

(Fourth Embodiment)

Next, a fourth embodiment of the present invention is described with reference to FIGS. 13 and 14. The fourth embodiment of the present invention differs from the first embodiment in that an intermediate tab 6 is provided with an insulator 31. The following description is centered on that point of difference.

Figure 13:
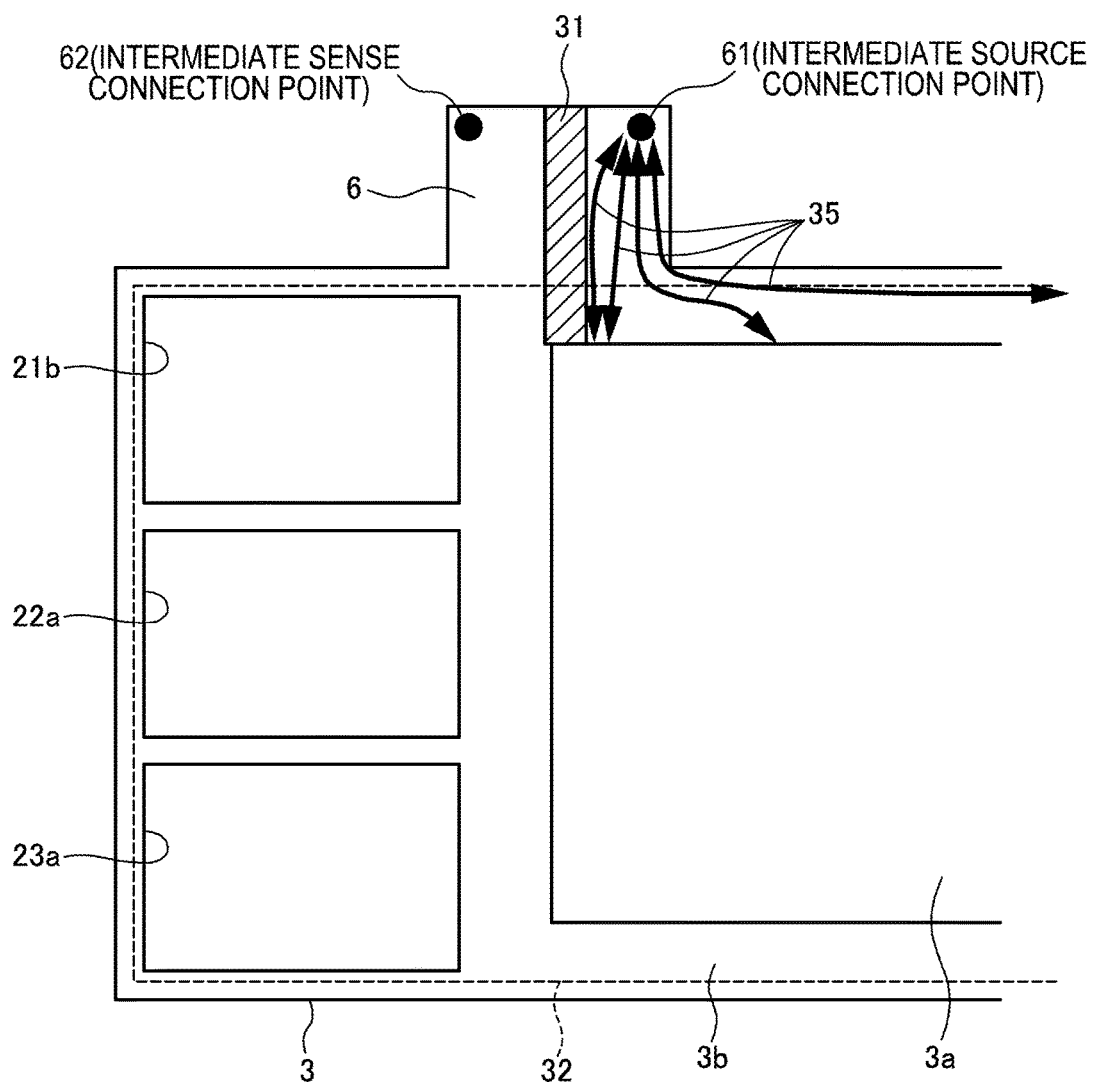
FIG. 13 is a schematic diagram showing a part of an intermediate separator according to a fourth embodiment of the present invention.

FIG. 13 is a schematic diagram of a part of an intermediate separator 3 according to the present embodiment showing flows of alternating currents input and output to and from an intermediate tab 6. FIG. 14 is a diagram schematically showing a non-power generation region 3b of the intermediate separator according to the present embodiment as an electric circuit.

As shown in FIG. 13, in the present embodiment, the intermediate separator 3 is provided with the insulator 31 extending from the intermediate tab 6 to a power generation region 3a. The insulator 31 is a material having a high resistance value such as resin or rubber.

An intermediate source connection point 61 and an intermediate sense connection point 62 are so arranged on the intermediate tab 6 that the intermediate source connection point 61 is located at a side opposite to the intermediate sense connection point 62 across the insulator 31. By forming a part of the intermediate separator 3 into the insulator 31 as in the present embodiment, the insulator 31 can be provided without being affected by a sealing member 32 for preventing gas leakage provided on an outer peripheral edge part of the intermediate separator 3.

It should be noted that although the intermediate source connection point 61 and the intermediate sense connection point 62 are so arranged on the intermediate tab 6 that the intermediate source connection point 61 is located on the side of the power generation region 3a with respect to the insulator 31 and the intermediate sense connection point 62 is located on the side of the non-power generation region 3b with respect to the insulator 31 in the present embodiment, the arrangement positions thereof are not particularly limited.

This can prevent alternating currents flowing on the non-power generation region 3b between the power generation region 3a and the intermediate source connection point 61 to flow to the non-power generation region 3b between the power generation region 3a and the intermediate sense connection point 62. Specifically, it is possible to electrically separate the intermediate sense connection point 62 from source current paths 35 by the insulator 31 and prevent the source current paths 35 from being formed on the side of the intermediate sense connection point 62 of the intermediate tab 6. Thus, in the case of using the intermediate separator 3 according to the present embodiment, the electric circuit on the intermediate separator 3 is as shown in FIG. 14 and an intermediate sense potential Vm, which is a potential of the intermediate sense connection point 62, is not affected by a voltage drop caused on the non-power generation region 3b of the intermediate separator 3 from the power generation region 3a to the intermediate source connection point 61. That is, a potential of the power generation region 3a of the intermediate separator 3 and the intermediate sense potential Vm become equal.

Thus, a positive-electrode side alternating-current voltage V1 (V1=Vc-Vm) and a negative-electrode side alternating-current voltage V2 (V2=Vm-Va) have a voltage drop value caused by membrane resistance Rm, wherefore the measurement accuracy of an internal resistance measuring device 70 can be improved.

In the present embodiment described above, a high resistance region is formed by arranging the insulator 31 between the intermediate tab 6 (source connection point tab) of a part including the intermediate source connection point 61 and the intermediate tab 6 (sense connection point tab) of a part including the intermediate sense connection point 62 as one mode of separation portion configured to separate the intermediate sense connection point 62 from the source current paths 35 of the alternating currents formed between the intermediate source connection point 61 and the power generation region 3a.

This enables the intermediate sense connection point 62 to be separated from the source current paths 35 by electrically separating the intermediate tab 6 (source connection point tab) of the part including the intermediate source connection point 61 and the intermediate tab 6 (sense connection point tab) of the part including the intermediate sense connection point 62.

Thus, the effect of a voltage drop between the intermediate source connection point 61 and the power generation region 3a on the potential of the intermediate sense connection point 62 can be eliminated. As a result, since the intermediate sense potential Vm can be made equal to the potential of the power generation region 3a of the intermediate separator 3, the positive-electrode side alternating-current voltage V1 (V1=Vc-Vm) and the negative-electrode side alternating-current voltage V2 (V2=Vm-Va) have the voltage drop value caused by the membrane resistance Rm. Thus, an error between an internal resistance calculated by an internal resistance measuring device 70 and an actual internal resistance can be eliminated, wherefore the measurement accuracy of the internal resistance measuring device 70 can be improved.

Further, since the intermediate separator 3 including the intermediate tab 6 and the insulator 31 are integrated in the present embodiment, the insulator 31 can be provided without being affected by the sealing member 32 for preventing gas leakage provided on the outer peripheral edge part of the intermediate separator 3.

(Fifth Embodiment)

Next, a fifth embodiment of the present invention is described with reference to FIG. 15. The fifth embodiment of the present invention differs from the first embodiment in including two intermediate tabs 6a, 6b. The following description is centered on that point of difference.

Figure 15:
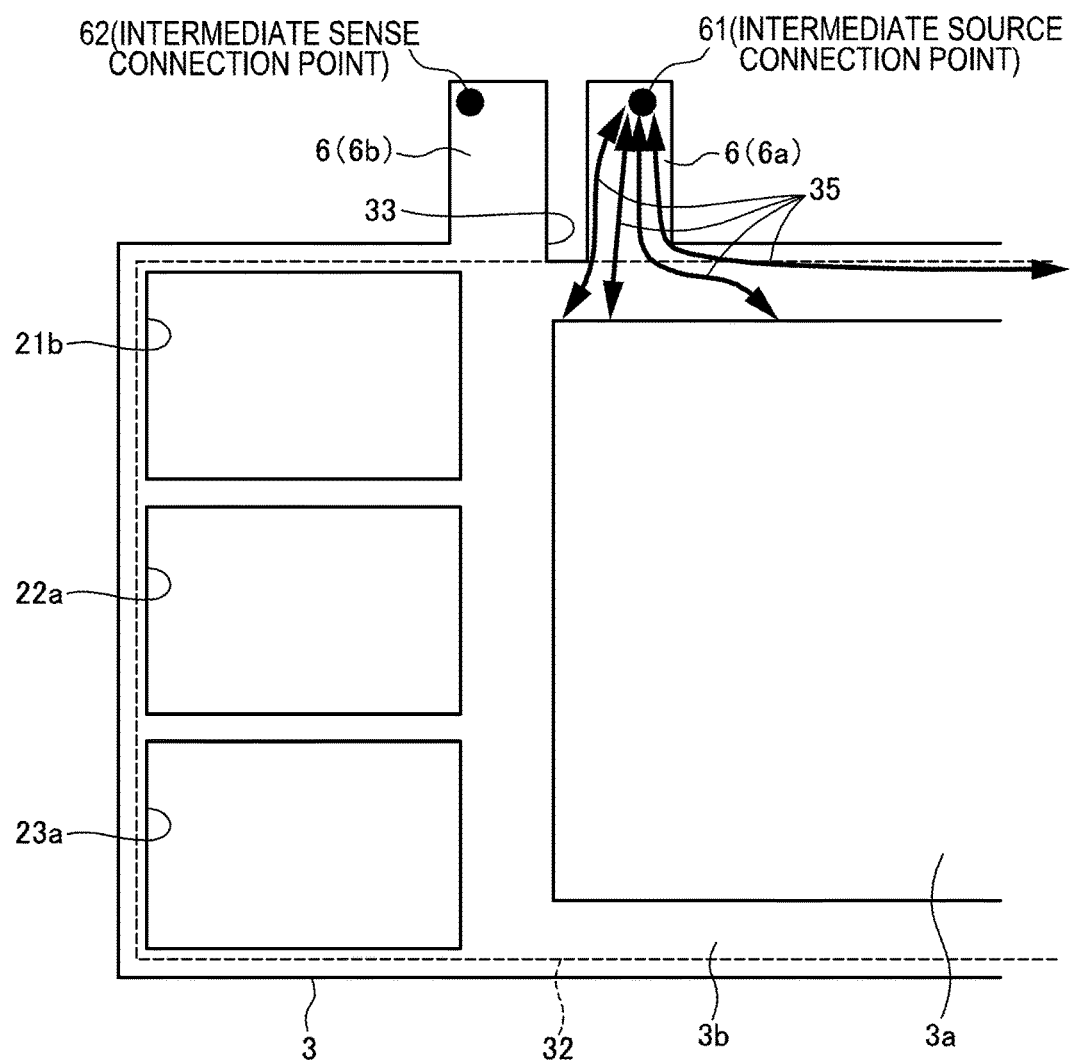
FIG. 15 is a schematic diagram showing a part of an intermediate separator according to a fifth embodiment of the present invention.

FIG. 15 is a schematic diagram of a part of an intermediate separator 3 according to the present embodiment showing flows of alternating currents input and output to and from the intermediate tabs 6a, 6b.

As shown in FIG. 15, the intermediate separator 3 according to the present embodiment includes the first and second intermediate tabs 6a, 6b and a slit 33.

The first intermediate tab 6a is formed by extending a non-power generation region 3b of the intermediate separator 3. An intermediate source line 77c is connected to the first intermediate tab 6a.

The second intermediate tab 6b is formed by extending the non-power generation region 3b of the intermediate separator 3. The second intermediate tab 6b is formed at a position at a predetermined distance from the first intermediate tab 6a to be adjacent to the first intermediate tab 6a. An intermediate sense line 78c is connected to the second intermediate tab 6b.

The slit 33 is formed in the non-power generation region 3b of the intermediate separator 3 between the first and second intermediate tabs 6a, 6b. The slit 33 is formed by making a cut from the outer edge of the intermediate separator 3 to a sealing material 32 for preventing gas leakage formed on an outer peripheral edge part of the intermediate separator 3.

By providing two tabs, to which the intermediate source line 77c and the intermediate sense line 78c are to be connected, and providing the slit 33 between them in this way, alternating currents flowing on the non-power generation region 3b between the power generation region 3a and the intermediate source connection point 61 can be prevented from flowing to the non-power generation region 3b between the power generation region 3a and the intermediate sense connection point 62 as in the fourth embodiment. Specifically, the formation of source current paths 35 on the side of the intermediate sense connection point 62 of the intermediate tab 6 can be prevented by physically separating the intermediate sense connection point 62 from the source current paths 35 by the slit 33. Thus, the measurement accuracy of an internal resistance measuring device 70 can be improved for the same reason as in the fourth embodiment.

In the present embodiment described above, a high resistance region is formed by forming the slit 33 between the first intermediate tab 6a (source connection point tab) and the second intermediate tab 6b (sense connection point tab) as one mode of separation portion configured to separate the intermediate sense connection point 62 from the source current paths 35 of the alternating currents formed between the intermediate source connection point 61 and the power generation region 3a.

This enables the intermediate sense connection point 62 to be separated from the source current paths 35 by physically separating the first intermediate tab 6a (source connection point tab) and the second intermediate tab 6b (sense connection point tab). Thus, the effect of a voltage drop between the intermediate source connection point 61 and the power generation region 3a on a potential of the intermediate sense connection point 62 can be eliminated. As a result, since an intermediate sense potential Vm can be made equal to a potential of the power generation region 3a of the intermediate separator 3, a positive-electrode side alternating-current voltage V1 (V1=Vc-Vm) and a negative-electrode side alternating-current voltage V2 (V2=Vm-Va) have a voltage drop value caused by a membrane resistance Rm. Thus, an error between an internal resistance calculated by the internal resistance measuring device 70 and an actual internal resistance can be eliminated, wherefore the measurement accuracy of the internal resistance measuring device 70 can be improved.

Figure 16:
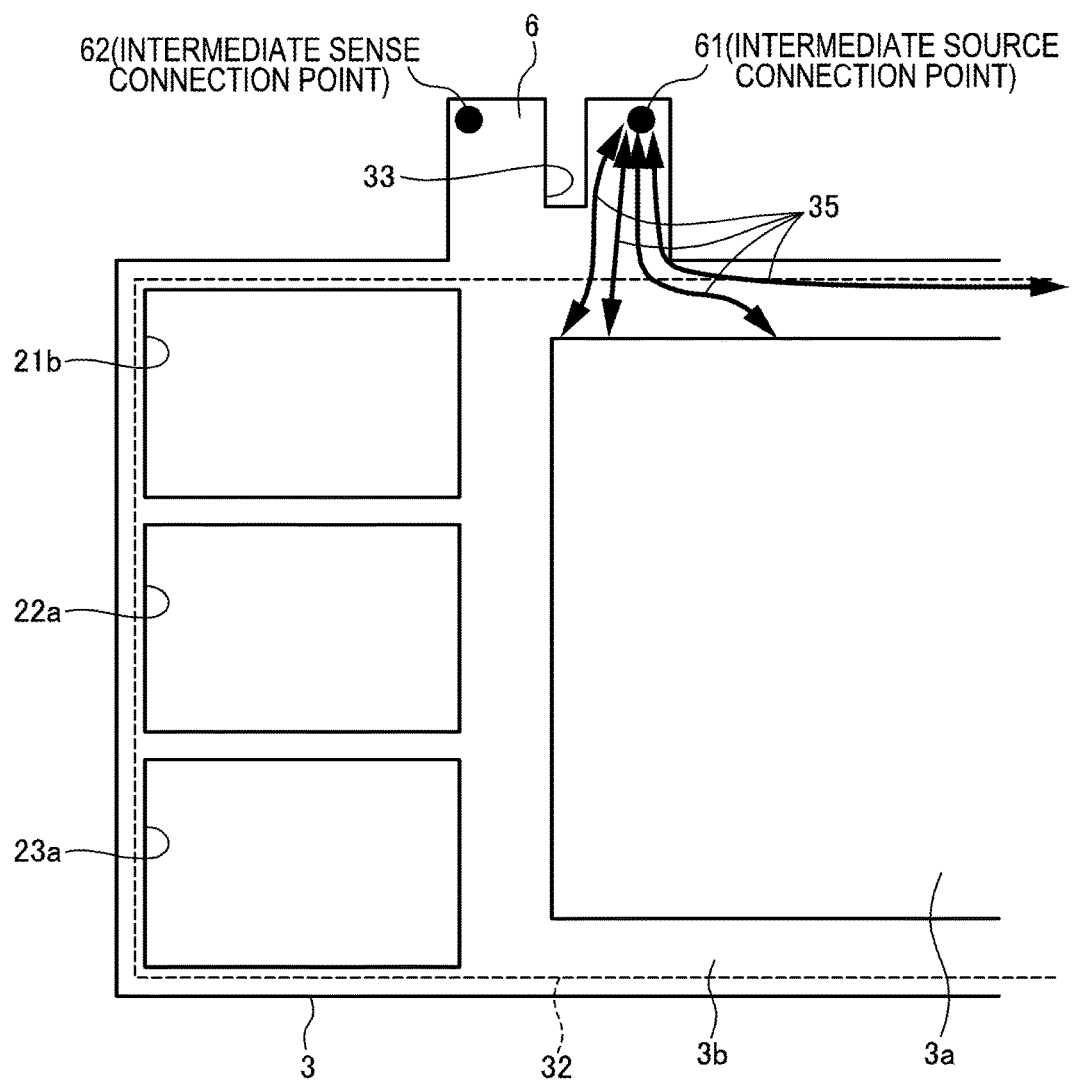
FIG. 16 is a schematic diagram showing a part of an intermediate separator according to a modification of the fifth embodiment of the present invention.

It should be noted that although the slit 33 is formed in the non-power generation region 3b of the intermediate separator 3 between the first and second intermediate tabs 6a, 6b in the present embodiment, a slit 33 may be formed in one intermediate tab 6, for example, as in an intermediate separator 3 according to a modification of the present embodiment shown in FIG. 16. Also in this way, functions and effects similar to those of the present embodiment can be obtained.

(Sixth Embodiment)

Next, a sixth embodiment of the present invention is described with reference to FIGS. 17 and 18. The sixth embodiment of the present invention differs from the first embodiment in including two intermediate tabs 6a, 6b and utilizing a space between them as a key groove 63 when a third connector 80c is connected. The following description is centered on those points of difference.

Figure 17:
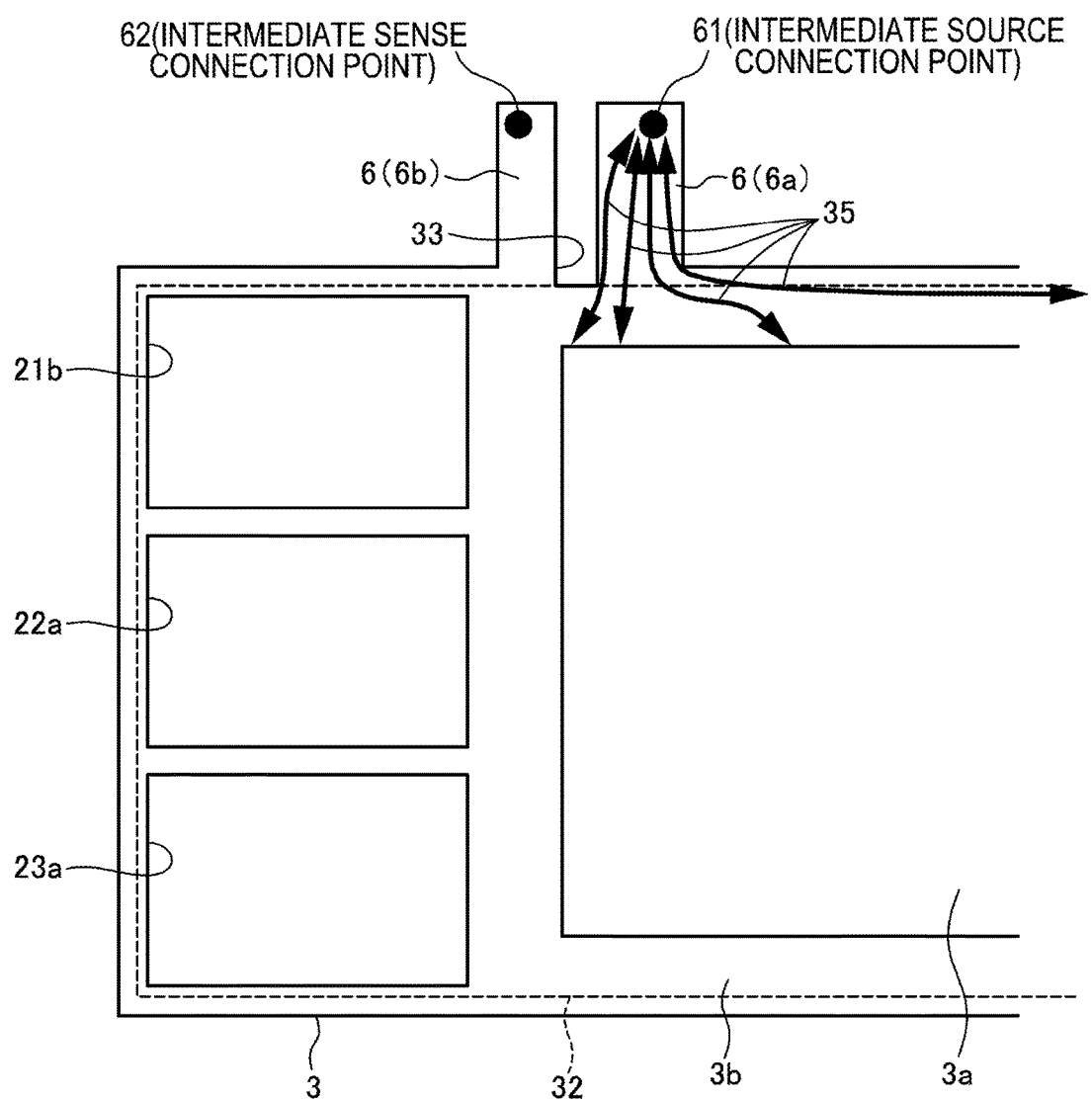
FIG. 17 is a schematic diagram showing a part of an intermediate separator according to a sixth embodiment of the present invention.

FIG. 17 is a schematic diagram of a part of a cathode separator 3 formed with an intermediate tab 6 according to the present embodiment.

As shown in FIG. 17, the intermediate separator 3 according to the present embodiment includes the first and second intermediate tabs 6a, 6b and a slit 33 as in the fifth embodiment. What is different in the present embodiment is that lateral widths of the first and second intermediate tabs 6a, 6b are different.

By making the lateral widths of the first and second intermediate tabs 6a, 6b different in this way, the space between the first and second intermediate tabs 6a, 6b can be utilized as the key groove 63 for preventing inverse connection when the third connector 80c is connected.

Figure 18:
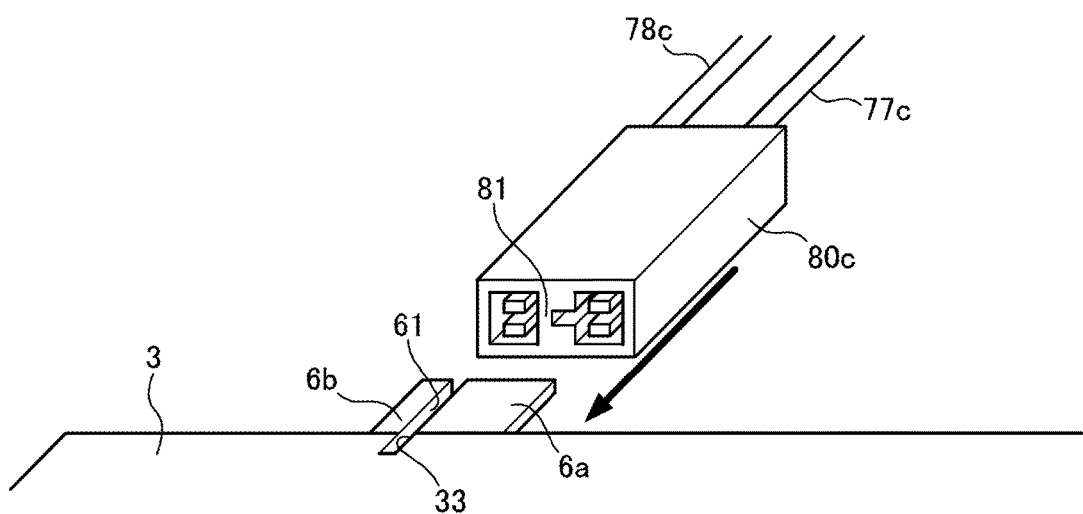
FIG. 18 is a diagram showing a connection method of a third connector according to the sixth embodiment of the present invention.

FIG. 18 is a diagram showing a connection method of the third connector 80c according to the present embodiment.

As shown in FIG. 18, an insertion port for the third connector 80c has a key shape in conformity with the lateral shapes of the first and second intermediate tabs 6a, 6b. The third connector 80c is formed with a key groove inserting portion 81 to be inserted into the key groove 63.

This enables the space between the first and second intermediate tabs 6a, 6b to be utilized as the key groove 63 and an intermediate source line 77c and an intermediate sense line 78c to be prevented from being erroneously connected to the non-corresponding ones of the first and second intermediate tabs 6a, 6b. Thus, the deterioration of the measurement accuracy of an internal resistance measuring device 70 due to a connection error can be prevented.

In a laminated battery 11 according to the present embodiment described above, the space between the first and second intermediate tabs 6a, 6b is utilized as the key groove 63 for preventing inverse connection when the intermediate source line 77c and the intermediate sense line 78c are collectively connected to the first and second intermediate tabs 6a, 6b using one third connector 80c.

This can prevent the deterioration of the measurement accuracy of the internal resistance measuring device 70 due to a connection error.

(Seventh Embodiment)

Next, a seventh embodiment of the present invention is described with reference to FIG. 19. The seventh embodiment of the present invention differs from the first embodiment in forming two tabs, i.e. a first intermediate tab 6a and a second intermediate tab 6b on an intermediate separator 3 and locating the first intermediate tab 6a on a side opposite to the second intermediate tab 6b across a power generation region 3a. The following description is centered on those points of difference.

Figure 19:
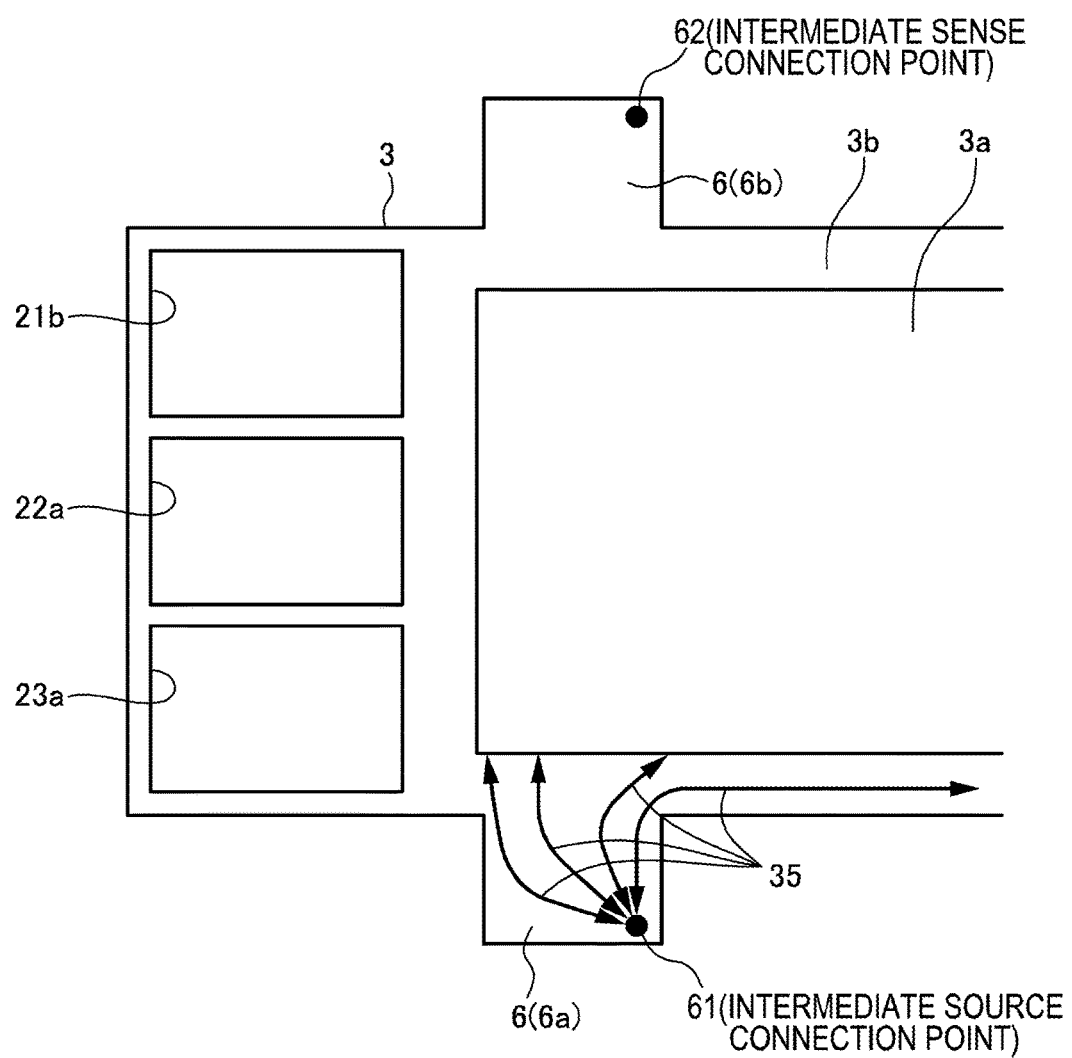
FIG. 19 is a schematic diagram showing a part of an intermediate separator according to a seventh embodiment of the present invention.

As shown in FIG. 19, the intermediate separator 3 according to the present embodiment includes the first and second intermediate tabs 6a, 6b.

The first intermediate tab 6a is formed on one long side of the intermediate separator 3. The second intermediate tab 6b is formed on the other long side of the intermediate separator 3. In this way, the first and second intermediate tabs 6a, 6b are formed on the intermediate separator 3 to be located at opposite sides across the power generation region 3a.

By arranging the first and second intermediate tabs 6a, 6b to face each other in this way, alternating currents flowing on a non-power generation region 3b between the power generation region 3a and an intermediate source connection point 61 can be prevented from flowing to the non-power generation region 3b between the power generation region 3a and the intermediate sense connection point 62 even if the intermediate separator 3 is not provided with the insulator 31 or the slit 33. Specifically, by arranging the first and second intermediate tabs 6a, 6b to face each other, a region between the first and second intermediate tabs 6a, 6b can be set as a high resistance region and the formation of source current paths 35 can be prevented.

Figure 14:
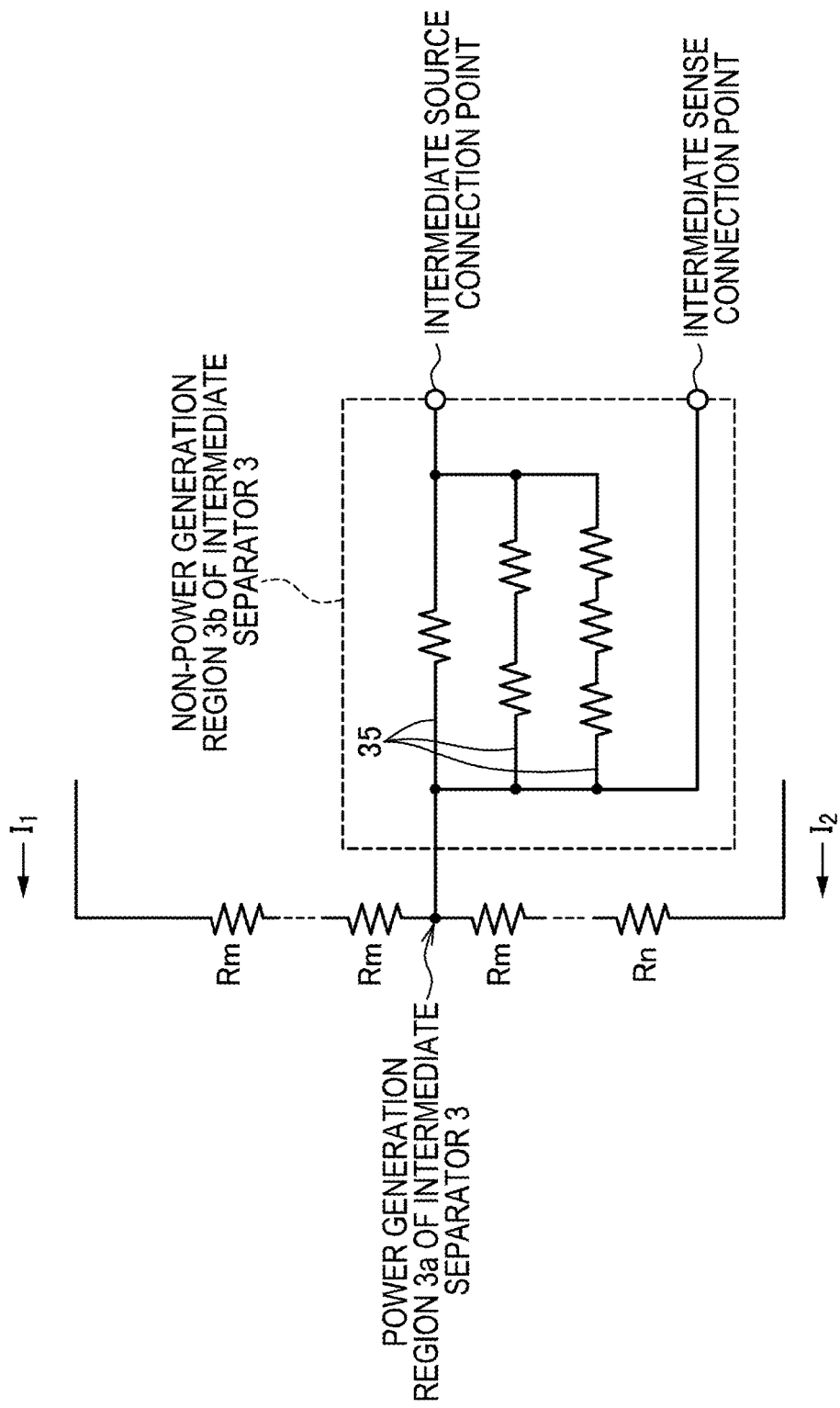
FIG. 14 is a diagram schematically showing a non-power generation region of the intermediate separator according to the fourth embodiment of the present invention as an electric circuit.

Thus, even in the case of using the intermediate separator 3 according to the present embodiment, an electric circuit on the intermediate separator 3 is as shown in FIG. 14 and an intermediate sense potential Vm, which is a potential of the intermediate sense connection point 62, is not affected by a voltage drop caused on the non-power generation region 3b of the intermediate separator 3 from the power generation region 3a to the intermediate source connection point 61. That is, a potential of the power generation region 3a of the intermediate separator 3 and the intermediate sense potential Vm become equal.

Thus, a positive-electrode side alternating-current voltage V1 (V1=Vc-Vm) and a negative-electrode side alternating-current voltage V2 (V2=Vm-Va) have a voltage drop value caused by a membrane resistance Rm, wherefore the measurement accuracy of an internal resistance measuring device 70 can be improved.

In the present embodiment described above, the high resistance region is formed between the first intermediate tab 6a (source connection point tab) and the second intermediate tab 6b (sense connection point tab) by arranging the first intermediate tab 6a (source connection point tab) and the second intermediate tab 6b (sense connection point tab) at positions facing each other across the power generation region 3 as one mode of separation portion configured to separate the intermediate sense connection point 62 from the source current paths 35 of alternating currents formed between the intermediate source connection point 61 and the power generation region 3a.

This enables the intermediate sense connection point 62 to be separated from the source current paths 35. Thus, the effect of a voltage drop between the intermediate source connection point 61 and the power generation region 3a on the potential of the intermediate sense connection point 62 can be eliminated. As a result, since the intermediate sense potential Vm can be made equal to the potential of the power generation region 3a of the intermediate separator 3, the positive-electrode side alternating-current voltage V1 (V1=Vc-Vm) and the negative-electrode side alternating-current voltage V2 (V2=Vm-Va) have the voltage drop value caused by the membrane resistance Rm. Thus, an error between an internal resistance calculated by the internal resistance measuring device 70 and an actual internal resistance can be eliminated, wherefore the measurement accuracy of the internal resistance measuring device 70 can be improved.

Figure 20:
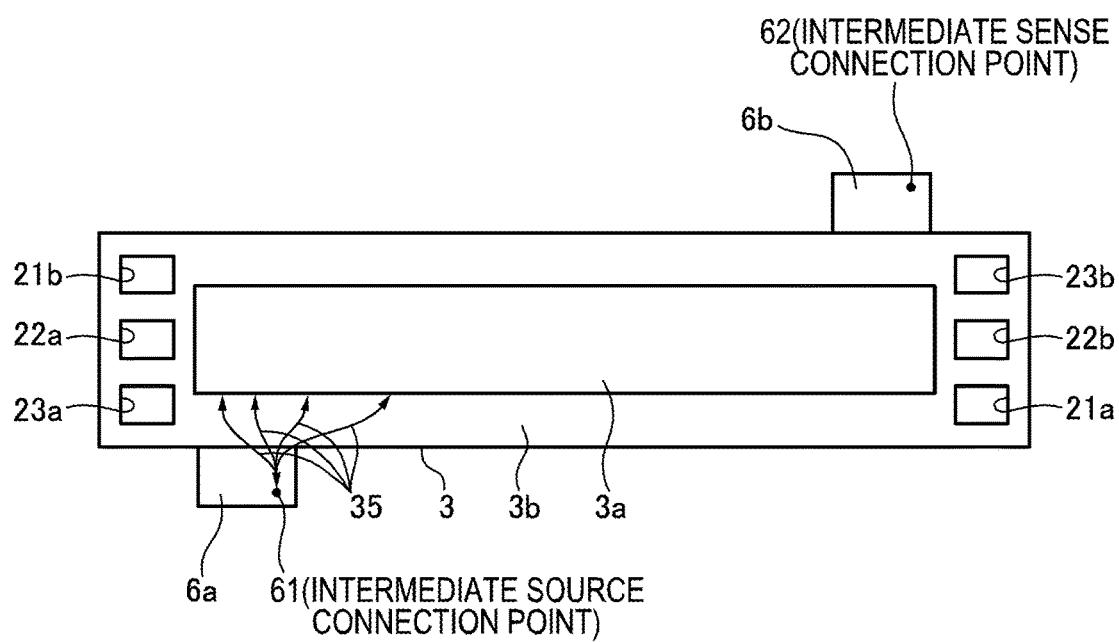
FIG. 20 is a schematic diagram showing a part of an intermediate separator according to a modification of the seventh embodiment of the present invention.

It should be noted that although the first and second intermediate tabs 6a, 6b are arranged at the positions facing each other across the power generation region 3a in the present embodiment, they may be arranged at positions diagonal to each other across the power generation region 3a, for example, as in an intermediate separator 3 according to a modification of the present embodiment shown in FIG. 20. Also in this way, functions and effects similar to those of the present embodiment can be obtained.

Although the embodiments of the present invention have been described above, the above embodiments are merely an illustration of some application examples of the present invention and not intended to limit the technical scope of the present invention to the specific configurations of the above embodiments.

Although the measurement object of the internal resistance R by the internal resistance measuring device 70 has been the fuel cell stack 10 in each of the above embodiments, the fuel cell stack 10 is only taken as an example of the laminated battery 1 (in which a plurality of cells are laminated) to be measured and there is no limitation to the fuel cell stack 10.

Although the fuel cell stack 10 has been used as the power source for driving the vehicle in each of the above embodiments, there is no limitation to this and the fuel cell stack 10 can be used as a power source of every electric system.

Although the first and second intermediate tabs 6a, 6b are provided on the long sides of the intermediate separator 3 to be located at the positions facing each other across the power generation region 3a in the above seventh embodiment, they may be provided on the short sides to face each other.

The invention claimed is:

1. A laminated battery system, comprising:
an alternating-current power supply unit connected to an internal resistance measurement object including at least a laminated battery, a unit cell being laminated in the laminated battery, and configured to output an alternating current to the internal resistance measurement object;
an alternating current adjustment unit programmed to input a positive-electrode side alternating-current and a negative-electrode side alternating-current, generate a command voltage based on the positive-electrode side alternating-current and the negative-electrode side alternating-current, and cause the alternating-current power supply unit to output, based on the generated command voltage, an adjusted alternating current such that a positive-electrode side alternating-current potential difference between a potential on a positive electrode side of the internal resistance measurement object and a potential of an intermediate part matches a negative-electrode side alternating-current potential difference between a potential on a negative-electrode side of the internal resistance measurement object and the potential of the intermediate part; and a calculation unit programmed to input the adjusted alternating current and alternating-current potential differences, and output, on the basis of the inputted adjusted alternating current and alternating-current potential differences, an internal resistance of the laminated battery;

wherein:

the unit cell includes:
- a separator; and
- a membrane electrode assembly forming a power generation region; and the separator includes:
- a source connection point tab connected to a source line, the source line inputting and outputting the alternating current from the alternating current adjustment unit;
- a sense connection point tab connected to a sense line, the sense line outputting a potential of the alternating current that is input and output through the source connection point tab; and
- a separation portion configured to separate the sense connection point tab from a current path of the alternating current from the source connection point tab to the power generation region such that a first distance between the source connection point tab to which the source line is connected and the power generation region is shorter than a second distance between the sense connection point tab to which the sense line is connected and the power generation region.

2. The laminated battery system according to claim 1, wherein:
the separation portion separates the sense connection point tab from the current path by an arrangement of a distant position of the sense connection point tab from the current path.

3. The laminated battery system according to claim 1, wherein:
the separation portion separates the sense connection point tab from the current path by a formation of a high resistance region between the source connection point tab and the sense connection point tab.

4. The laminated battery system according to claim 1, wherein:
the source connection point tab is connected with the sense connection point tab so as to form one tab.

5. The laminated battery system according to claim 3, wherein:
the high resistance region is formed by forming a slit between the source connection point tab and the sense connection point tab.

6. The laminated battery system according to claim 3, wherein:
the high resistance region is formed by arranging an insulator between the source connection point tab and the sense connection point tab.

7. A connection method of an internal resistance measuring device for measuring an internal resistance of a laminated battery, unit cells each including a membrane electrode assembly forming a power generation region being laminated in the laminated battery,
the internal resistance measuring device including a source line connected to a separator in an intermediate part of the laminated battery for inputting and outputting an alternating current and a sense line connected to the separator for outputting a potential of the alternating current input and output to and from the source line to the internal resistance measuring device, the connection method comprising:
connecting the sense line at a position distant from a current path of the alternating current formed between a connecting portion of the source line and the power generation region,
wherein a first distance between a source connection point at which the source line is connected to the separator and the power generation region is shorter than a second distance between a sense connection point at which the sense line is connected to the separator and the power generation region.

8. A laminated battery system, comprising:
an alternating-current power supply unit connected to an internal resistance measurement object including at least a laminated battery, a unit cell being laminated in the laminated battery, and configured to output an alternating current to the internal resistance measurement object;

an alternating current adjustment unit programmed to input a positive-electrode side alternating-current and a negative-electrode side alternating-current, generate a command voltage based on the positive-electrode side alternating-current and the negative-electrode side alternating-current, and cause the alternating-current power supply unit to output, based on the generated command voltage, an adjusted alternating current such that a positive-electrode side alternating-current potential difference between a potential on a positive electrode side of the internal resistance measurement object and a potential of an intermediate part matches a negative-electrode side alternating-current potential difference between a potential on a negative-electrode side of the internal resistance measurement object and the potential of the intermediate part; and a calculation unit programmed to input the adjusted alternating current and alternating-current potential differences, and output, on the basis of the inputted adjusted alternating current and alternating-current potential differences, an internal resistance of the laminated battery;

wherein:

the unit cell includes:
a separator; and
a membrane electrode assembly forming a power generation region; and the separator includes:
a source connection point tab connected to a source line, the source line inputting and outputting the alternating current from the alternating current adjustment unit;
a sense connection point tab connected to a sense line, the sense line outputting a potential of the alternating current that is input and output through the source connection point tab;
wherein the source connection point tab to which the source line is connected and the sense connection point tab to which the sense line is connected are located at positions facing or diagonal to each other across the power generation region.

9. The laminated battery system according to claim 1, wherein the source connection point tab to which the source line is connected and the sense connection point tab to which the sense line is connected are located on a same side of the separator.

* * * * *